(12) United States Patent
Magrino et al.

(10) Patent No.: US 12,612,806 B1
(45) Date of Patent: Apr. 28, 2026

(54) SWIVEL MOUNT KIT

(71) Applicant: Crestron Electronics, Inc., Rockleigh, NJ (US)

(72) Inventors: Charles Magrino, Cresskill, NJ (US); King Woo Cheung, New City, NY (US)

(73) Assignee: Crestron Electronics, Inc., Rockleigh, NJ (US)

( * ) Notice: Subject to any disclaimer, the term of this patent is extended or adjusted under 35 U.S.C. 154(b) by 42 days.

(21) Appl. No.: 18/930,225

(22) Filed: Oct. 29, 2024

(51) Int. Cl.
*E05B 73/00* (2006.01)
*H05K 5/02* (2006.01)

(52) U.S. Cl.
CPC ........ *E05B 73/0082* (2013.01); *H05K 5/0204* (2013.01)

(58) Field of Classification Search
CPC ... F16M 11/08; E05B 73/0082; H05K 5/0204
See application file for complete search history.

(56) References Cited

U.S. PATENT DOCUMENTS

| | | | |
|---|---|---|---|
| 5,377,598 A | 1/1995 | Kirchner | |
| 6,231,020 B1 | 5/2001 | Willson | |
| 6,256,193 B1 | 7/2001 | Janik | |
| 6,443,417 B2 * | 9/2002 | Galant | E05B 73/0082 |
| | | | 248/553 |
| 6,941,694 B2 * | 9/2005 | Ernst | A01K 97/10 |
| | | | 43/17 |
| 7,481,170 B2 | 1/2009 | Sommerfield | |
| 7,677,517 B2 | 3/2010 | Suzuki | |

| | | | |
|---|---|---|---|
| 8,698,617 B2 | 4/2014 | Henson | |
| 9,599,276 B2 | 3/2017 | Grziwok | |
| 9,936,823 B2 | 4/2018 | Galant | |
| 10,258,026 B2 * | 4/2019 | Thomas | F16M 11/2014 |
| 10,677,386 B2 | 6/2020 | Hoang | |
| 10,858,865 B2 | 12/2020 | Kelsch | |
| 10,920,922 B2 | 2/2021 | Chapuis | |
| 11,268,650 B2 | 3/2022 | Kim | |

(Continued)

OTHER PUBLICATIONS

Spec Sheet, "CCS-UCA-SMK, Swivel Mount Kit for CCS-UC-1", © 2017 Crestron Electronics, Inc., https://www.crestron.com/Products/Workspace-Solutions/Unified-Communications/Crestron-Mercury-Accessories/CCS-UCA-SMK.

(Continued)

*Primary Examiner* — Bradley Duckworth
(74) *Attorney, Agent, or Firm* — Crestron Electronics, Inc.

(57) ABSTRACT

A swivel mount kit includes a first insertable part having a hollow, cylindrical body and a first plate part attached thereto. An upper surface of the first plate part includes a curved track and with a particular shape and dimensions. A second insertable part includes an elongated body and a second plate part attached thereto. A lower surface of the second plate part includes a protrusion that extends away and has a location, shape and dimensions that correspond to those of the locking region and those of the curved track. When the elongated body is inserted into a central opening of the first insertable part and the protrusion is inserted into the locking region, the protrusion fits securely and prevents the second insertable part from moving. When the protrusion is instead inserted into the curved track, the protrusion is movable and the second insertable part is rotatable about an axis.

20 Claims, 16 Drawing Sheets

(56)                    References Cited

U.S. PATENT DOCUMENTS

| 11,294,414 | B2 * | 4/2022 | Shainwald | ......... | A61B 17/3417 |
| 11,448,356 | B2 | 9/2022 | Horvath | | |
| 11,829,201 | B2 * | 11/2023 | Cheung | ................. | H01R 13/62 |
| 2009/0255588 | A1 | 10/2009 | Bors | | |
| 2009/0256048 | A1 | 10/2009 | Fujikawa et al. | | |
| 2009/0321186 | A1 | 12/2009 | Louchart | | |
| 2012/0037783 | A1 | 2/2012 | Alexander | | |
| 2012/0193486 | A1 | 8/2012 | Levin | | |
| 2013/0043369 | A1 | 2/2013 | Wheeler | | |
| 2013/0301216 | A1 | 11/2013 | Trinh | | |
| 2014/0048667 | A1 | 2/2014 | Ziesen | | |
| 2015/0208826 | A1 | 7/2015 | Yang et al. | | |
| 2015/0327693 | A1 | 11/2015 | Ballhatchet | | |
| 2019/0063666 | A1 | 2/2019 | Hoang | | |
| 2021/0270410 | A1 | 9/2021 | Horvath | | |
| 2024/0200366 | A1 * | 6/2024 | Cheung | ............... | E05B 73/0082 |

OTHER PUBLICATIONS

Spec Sheet, "TS-770-1070-SMK Swivel Mount Kit for TS-70 Series", © 2020 Crestron Electronics, Inc., https://www.crestron.com/Products/Control-Surfaces/Accessories/Mounting-Hardware/TS-770-1070-SMK.

Spec Sheet, "SMK-MP/MPC/IPAC Swivel Mount Kit for TTK-MP/MPC/IPAC", © 2018 Crestron Electronics, Inc., https://www.crestron.com/Products/Control-Surfaces/Accessories/Mounting-Hardware/SMK-MP-MPC-IPAC.

Spec Sheet, "TSW-560/760/1060-SMK Swivel Mount Kit for TSW-560-TTK, TSW-760-TTK & TSW-1060-TTK",© 2016 Crestron Electronics, Inc., https://www.crestron.com/Products/Control-Surfaces/Accessories/Mounting-Hardware/TSW-560-760-1060-SMK.

Spec Sheet, "SMK-8T Swivel Mount Kit for TPMC-8T and TPMC-8X-DS", © 2011 Crestron Electronics, Inc., https://www.crestron.com/Products/Inactive/Discontinued/N-Z/SMK-8T.

Spec Sheet, "SMK-3000 Swivel Mount Kit for TPS-3000 and TPS-4000", Crestron Electronics, Inc., https://www.crestron.com/Products/Control-Surfaces/Accessories/Mounting-Hardware/SMK-3000.

Spec Sheet, "SMK-12/15/17 Swivel Mount Kit for new Isys Tilt Touchpanels", Crestron Electronics, Inc., https://www.crestron.com/Products/Control-Surfaces/Accessories/Mounting-Hardware/SMK-12-15-17.

Spec Sheet, "SMK-6X Swivel Mount Kit for TPS-6, TPS-6X, & TPS-6X-DS", © 2012 Crestron Electronics, Inc., https://www.crestron.com/Products/Control-Surfaces/Accessories/Mounting-Hardware/SMK-6X.

* cited by examiner

FIXED POSITION

SWIVEL MOUNT KIT

BACKGROUND OF THE INVENTION

Technical Field

The present embodiments relate to a kit or assembly for mounting an electronic device to a tabletop or other mounting structure and, more particularly, to a kit or assembly that is suitable for mounting any one of various different electronic devices to the tabletop or other mounting structure and for mounting these electronic devices in either a locked position or a swiveling position.

Background Art

In many applications where tabletop devices are used, such as touchscreens, displays, speakers, conferencing devices, or other electronic devices, it is desirable to mount the electronic device to a surface. Such surfaces may be a tabletop in a conference room or elsewhere, a lectern, a desktop, or other mounting structure. In some applications, it is desired that the position of the electronic device be fixed and not be changeable after the device is mounted. In other applications, it is desirable for the user to be able to modify the orientation or positioning of the electronic device.

Typically, kits are available for mounting the electronic device to the tabletop or other mounting structure and are usually made or sold by the manufacturer of the electronic device. However, a specific mounting kit is often needed for each model of electronic device, even when such different electronic devices are made by the same manufacturer. Moreover, the mounting kits are typically configured either for mounting the electronic device at a fixed position or to movably mount the electronic device, but are not configured for both types of mounting. Moreover, the manufacturers of such electronic devices often market only one of the above types of mounting kit, either for fixed position mounting or movable mounting, but do not market both types.

It is therefore desirable to provide a kit or assembly that is suitable for both fixed position mounting of an electronic device to a tabletop or other mounting structure and movable mounting of the electronic device to the tabletop or other mounting structure.

It is further desirable to provide a kit or assembly for mounting electronic devices to a tabletop or other mounting structure in which the same kit or assembly is suitable for mounting a variety of different types of electronic devices.

SUMMARY OF THE INVENTION

It is to be understood that both the general and detailed descriptions that follow are exemplary and explanatory only and are not restrictive.

DISCLOSURE OF INVENTION

In accordance with an aspect, a swivel mount kit comprises (a) a first insertable part, comprising (1) a hollow, cylindrical body having an outer wall, at least part of the outer wall being threaded, (2) a first plate part attached to an end of the cylindrical body, and (3) a central opening that extends through the first plate part and through the cylindrical body to another end of the cylindrical body, (4) wherein (A) a lower surface of the first plate part faces the cylindrical body, and (B) an opposing upper surface of the first plate part faces away from the cylindrical body, and includes (i) a curved track formed at a predefined depth in the upper surface and having a predefined width, the curved track extending along a part of an imaginary circle that is concentric with the central opening and co-planar with the upper surface, and (ii) a locking region formed at the predefined depth in the upper surface at another location on the imaginary circle and having a particular shape and particular dimensions; (b) a second insertable part, comprising (1) an elongated body configured for insertion into the central opening of the first insertable part, and (2) a second plate part attached to an end of the elongated body, wherein (A) an upper surface faces away from the elongated body, and (B) an opposing lower surface faces the elongated body, and includes (i) a protrusion extending away from the lower surface and having a particular shape and particular dimensions that correspond to the particular shape and particular dimensions of the locking region and that correspond to the predefined width of the curved track, the protrusion being disposed at a particular distance from a center of the elongated body that is a same distance as a radius of the imaginary circle, such that (I) upon the elongated body of the second insertable part being inserted into the central opening of the first insertable part and upon the protrusion being inserted into the locking region, the protrusion fits securely into the locking region and prevents the second insertable part from moving, and (II) upon the elongated body of the second insertable part being inserted into the central opening of the first insertable part and upon the protrusion being inserted into any location on the curved track, the protrusion is movable along the curved track, the second insertable part thereby being rotatable about a central axis of the central opening within a range of rotation limited by the movement of the protrusion; and (c) a securing part, including (1) a circular ring part that is threaded on its inside such that the ring part is rotatable along the threaded part of the outer wall of the cylindrical body of the first insertable part.

According to a further aspect, a swivel mount kit for rotational mounting of an electronic device to a mounting structure comprises (a) a first insertable part, comprising (1) a hollow, cylindrical body having an outer wall, at least part of the outer wall being threaded, the cylindrical body being configured to be inserted into an opening in the mounting structure, the opening extending from a first surface of the mounting structure to an opposing second surface of the mounting structure, (2) a first plate part attached to an end of the cylindrical body, and (3) a central opening that extends through the first plate part and through the cylindrical body to another end of the cylindrical body, (4) wherein (A) a lower surface of the first plate part faces the cylindrical body, the lower surface being configured to contact the first surface of the mounting structure upon the cylindrical body being inserted into the opening in the mounting structure, (B) an opposing upper surface of the first plate part faces away from the cylindrical body, and includes (i) a curved track formed at a predefined depth in the upper surface and having a predefined width, the curved track extending along a part of an imaginary circle that is concentric with the central opening and co-planar with the upper surface, and (ii) a locking region formed at the predefined depth in the upper surface at another location on the imaginary circle and having a particular shape and particular dimensions; (b) an alignment feature attached to the lower surface of the first plate part and configured to position the first insertable part while the cylindrical body is inserted into the opening in the mounting structure, the alignment feature being a circular element configured to be inserted into another opening in the mounting structure; and (c) a securing part configured to secure the first insertable part to the mounting structure, and including (1) a circular ring part that is threaded on its inside such that the ring part is rotatable along the threaded part of the outer wall of the cylindrical body of the first insertable part, wherein (2) the securing body is configured to be turned about the threads of the cylindrical body until the securing body presses against the second, opposing surface of the mounting structure, thereby securing the first insertable part to the mounting structure.

According to a still further aspect, a swivel mount kit for rotational mounting of an electronic device to a mounting structure comprises (a) a first insertable part, comprising (1) a hollow, cylindrical body having an outer wall, at least part of the outer wall being threaded, the cylindrical body being configured to be inserted into an opening in the mounting structure, the opening extending from a first surface of the mounting structure to an opposing second surface of the mounting structure, (2) a circular first plate part attached to an end of the cylindrical body, and (3) a central opening that extends through the first plate part and through the cylindrical body to another end of the cylindrical body, the central opening forming a circular ring at the another end of the cylindrical body, (4) wherein (A) a lower surface of the first plate part faces the cylindrical body, the lower surface being configured to contact the first surface of the mounting structure upon the cylindrical body being inserted into the opening in the mounting structure, (B) an opposing upper surface of the first plate part faces away from the cylindrical body, and includes (i) a curved track formed at a predefined depth in the upper surface and having a predefined width, the curved track extending along a part of a circumference of the upper surface of the first plate part, and (ii) a locking region formed at the predefined depth in the upper surface at another location on the circumference of the upper surface of the first plate part and having a particular shape and particular dimensions; (b) an alignment feature attached to the lower surface of the first plate part and configured to position the first insertable part while the cylindrical body is inserted into the opening in the mounting structure, the alignment feature being a circular element configured to be inserted into another opening in the mounting structure; (c) a securing part configured to secure the first insertable part to the mounting structure, and including (1) a circular ring part that is threaded on its inside such that the ring part is rotatable along the threaded part of the outer wall of the cylindrical body of the first insertable part, wherein (2) the securing body is configured to be turned about the threads of the cylindrical body until the securing body presses against the second, opposing surface of the mounting structure, thereby securing the first insertable part to the mounting structure; (d) a second insertable part configured for mounting the electronic device, and comprising (1) an elongated body configured for insertion into the central opening of the first insertable part, including (A) a pair of spring-like elements which extend from an outer wall of the elongated body at an end of the elongated body, wherein (B) upon the elongated body of the second insertable part being inserted into the central opening of the first insertable part, the pair of spring-like elements extend past the circular ring at the end of the cylindrical body and extend outward to secure a top surface of the spring-like elements against the circular ring of the cylindrical body, and (2) a circular second plate part attached to another end of the elongated body, wherein (A) an upper surface faces away from the elongated body, and (B) an opposing lower surface faces the elongated body, and includes (i) a protrusion extending away from the lower surface and having a particular shape and particular dimensions that correspond to the particular shape and particular dimensions of the locking region and that correspond to the predefined width of the curved track, the protrusion being one of a rectangular shaped block or pedestal, and the locking region being a rectangular shaped opening having a particular length and width that correspond to a particular length and width of the block or pedestal, the protrusion being disposed at a particular distance from a center of the elongated body that is a same distance as a radius of the first plate part, such that (I) upon the elongated body of the second insertable part being inserted into the central opening of the first insertable part and upon the protrusion being inserted into the locking region, the protrusion fits securely into the locking region and prevents the second insertable part from moving, and (II) upon the elongated body of the second insertable part being inserted into the central opening of the first insertable part and upon the protrusion being inserted into any location on the curved track, the protrusion is movable along the curved track, the second insertable part thereby being rotatable about a central axis of the central opening within a range of rotation limited by the movement of the protrusion.

BRIEF DESCRIPTION OF DRAWINGS

The accompanying figures further illustrate the present embodiments.

The components in the drawings are not necessarily drawn to scale, emphasis instead being placed upon clearly illustrating the principles of the present embodiments. In the drawings, like reference numerals designate corresponding parts throughout the several views.

BRIEF DESCRIPTION OF THE SEVERAL VIEWS OF THE DRAWING

Figure 1:
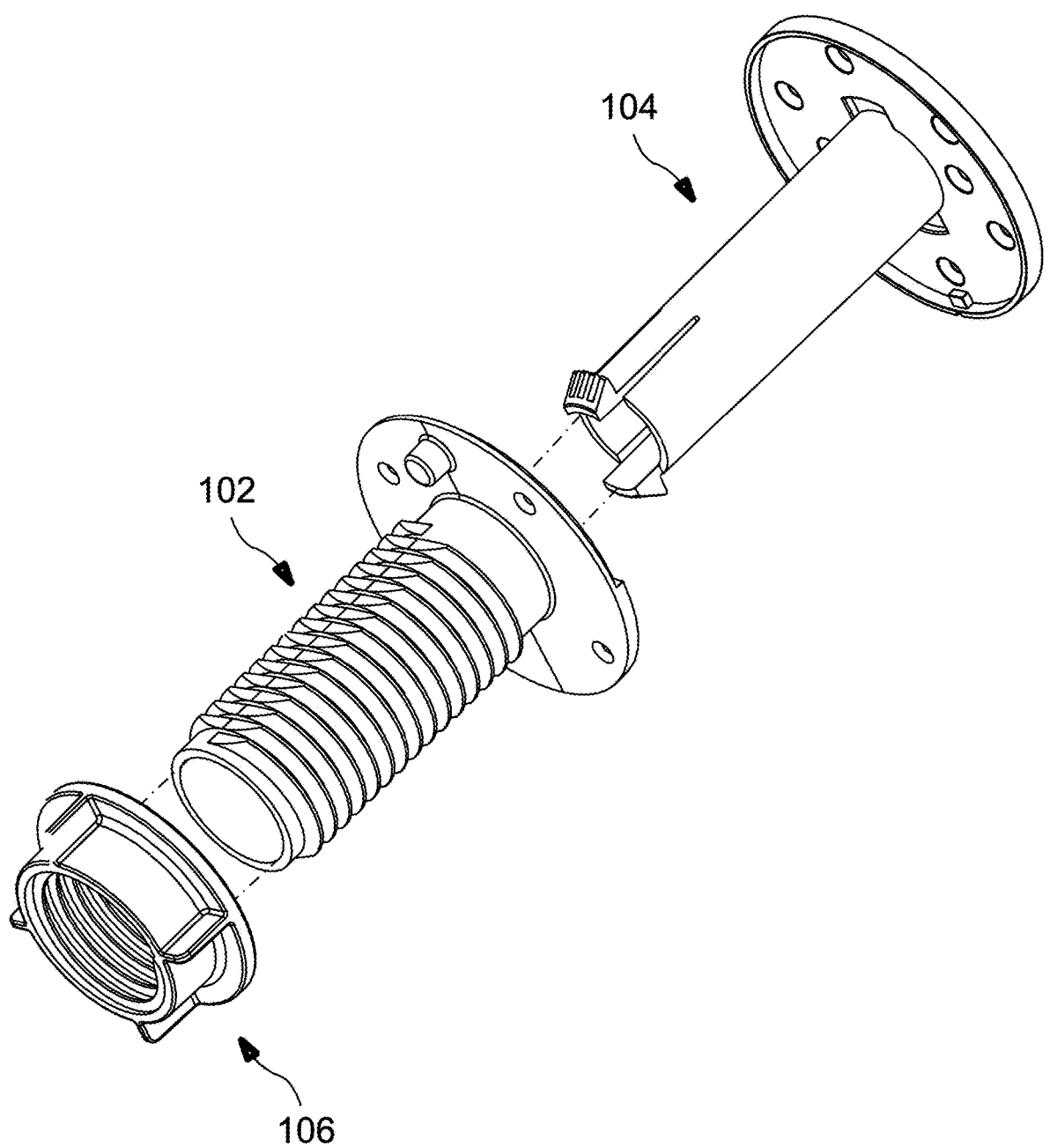

FIG. 1 is an exploded perspective view of a swivel mount kit or assembly in accordance with an embodiment.

Figure 2:
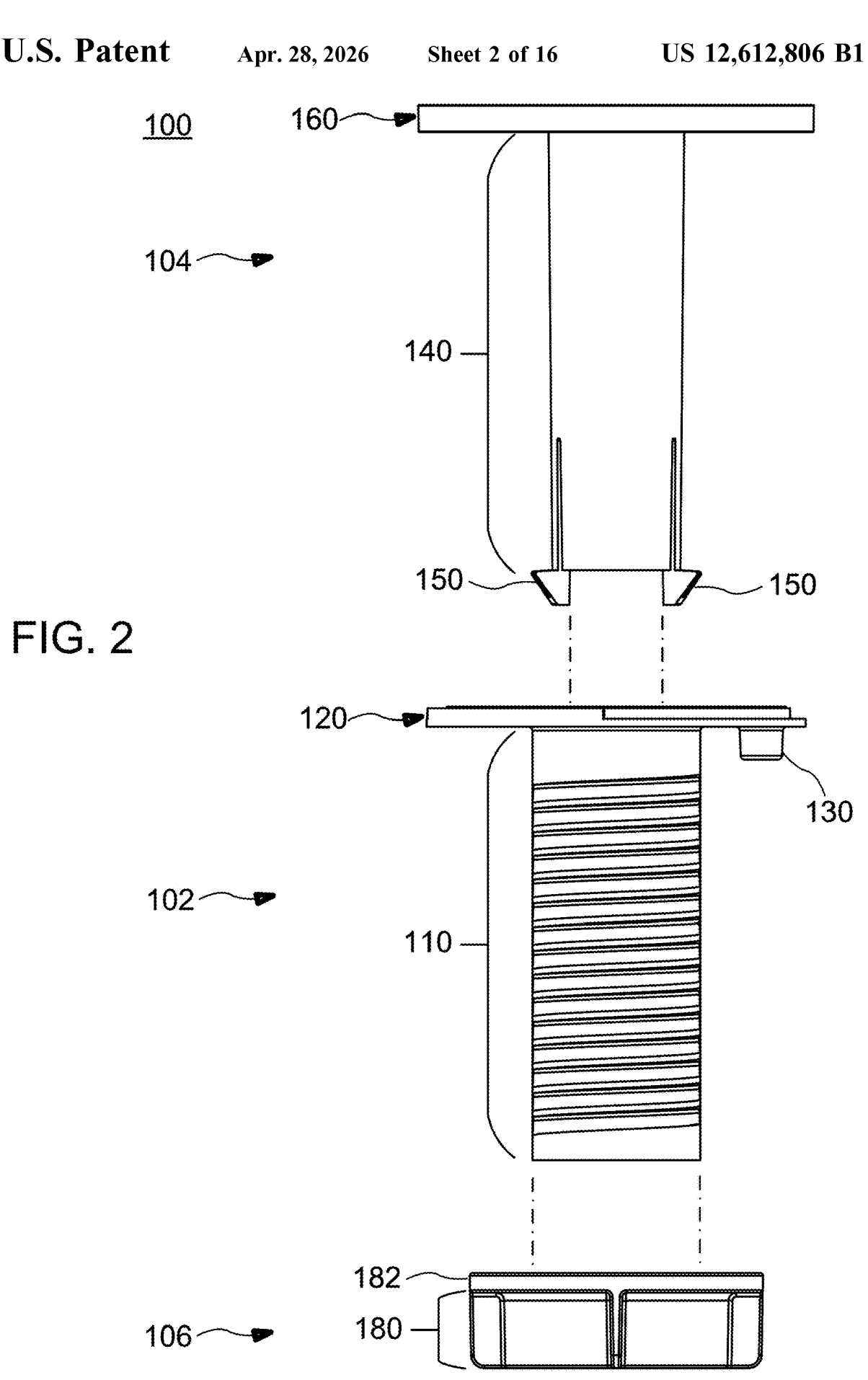

FIG. 2 is an exploded front view of the swivel mount kit or assembly of FIG. 1.

Figures 3A, 3B:
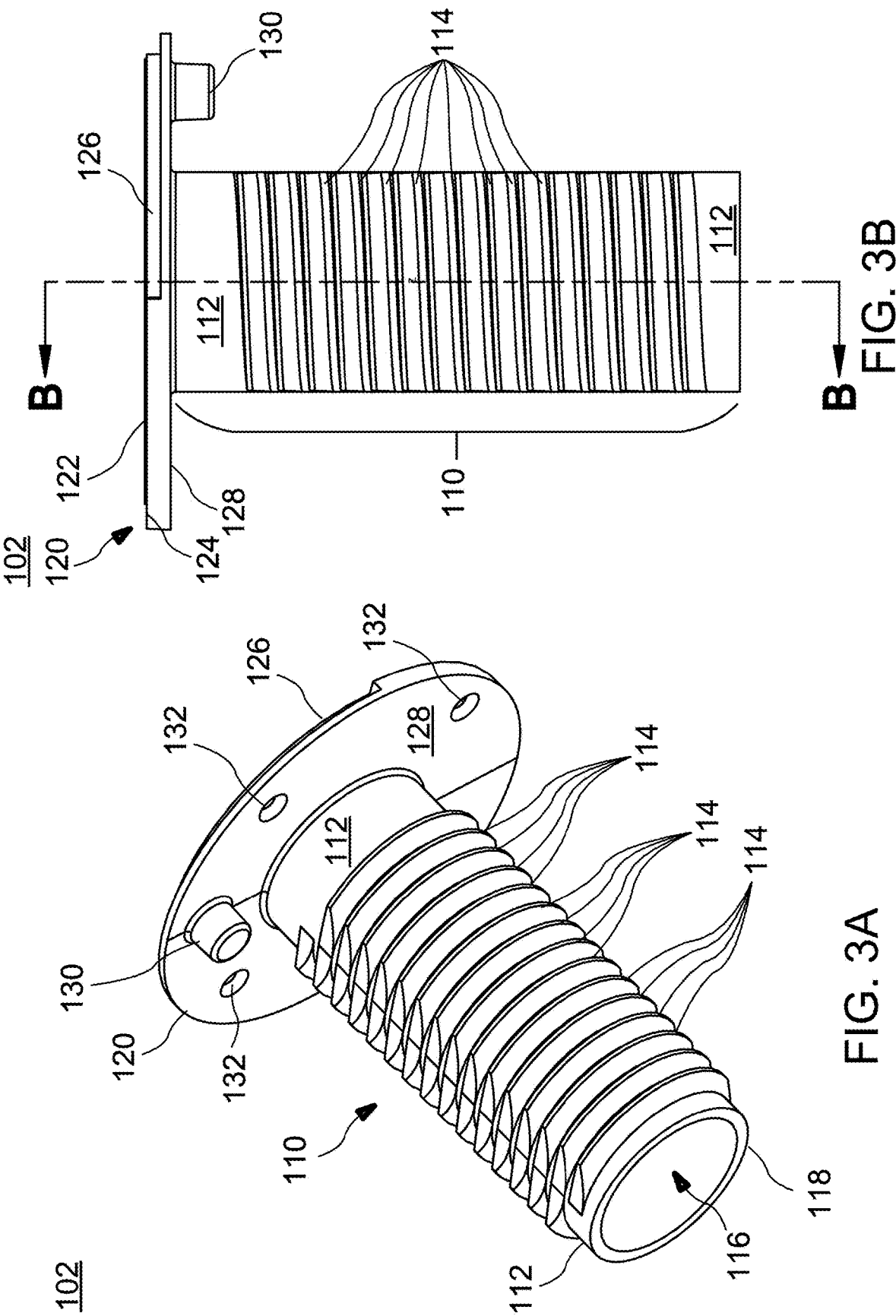
Figures 3C, 3D:
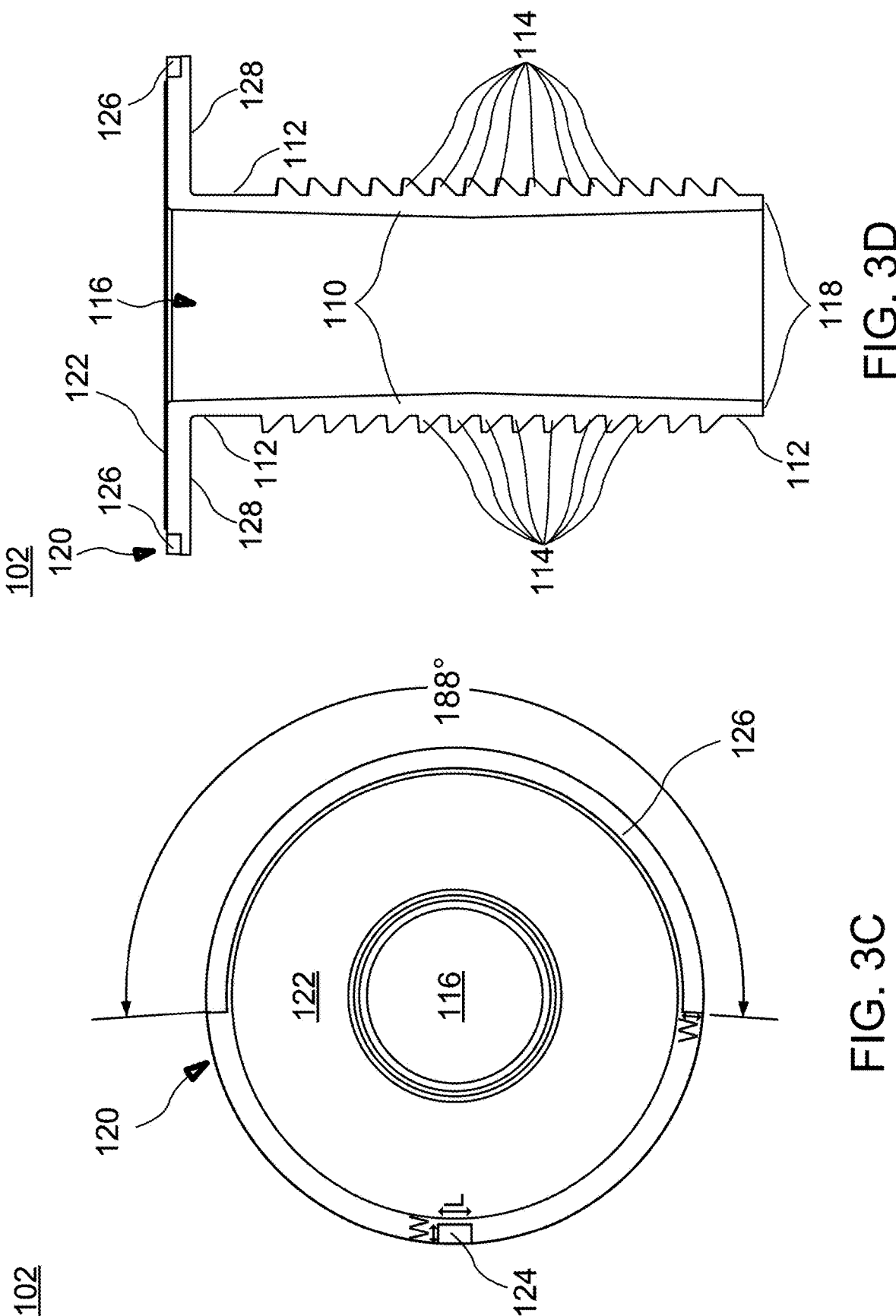

FIGS. 3A-3C are perspective, front elevation, and top plan views, respectively, of a threaded bulkhead or first insertable part of the swivel mount kit or assembly of FIGS. 1 and 2; and FIG. 3D is a cross-sectional view of the first insertable part taken along line B-B of the front view of FIG. 3B.

Figure 4A:
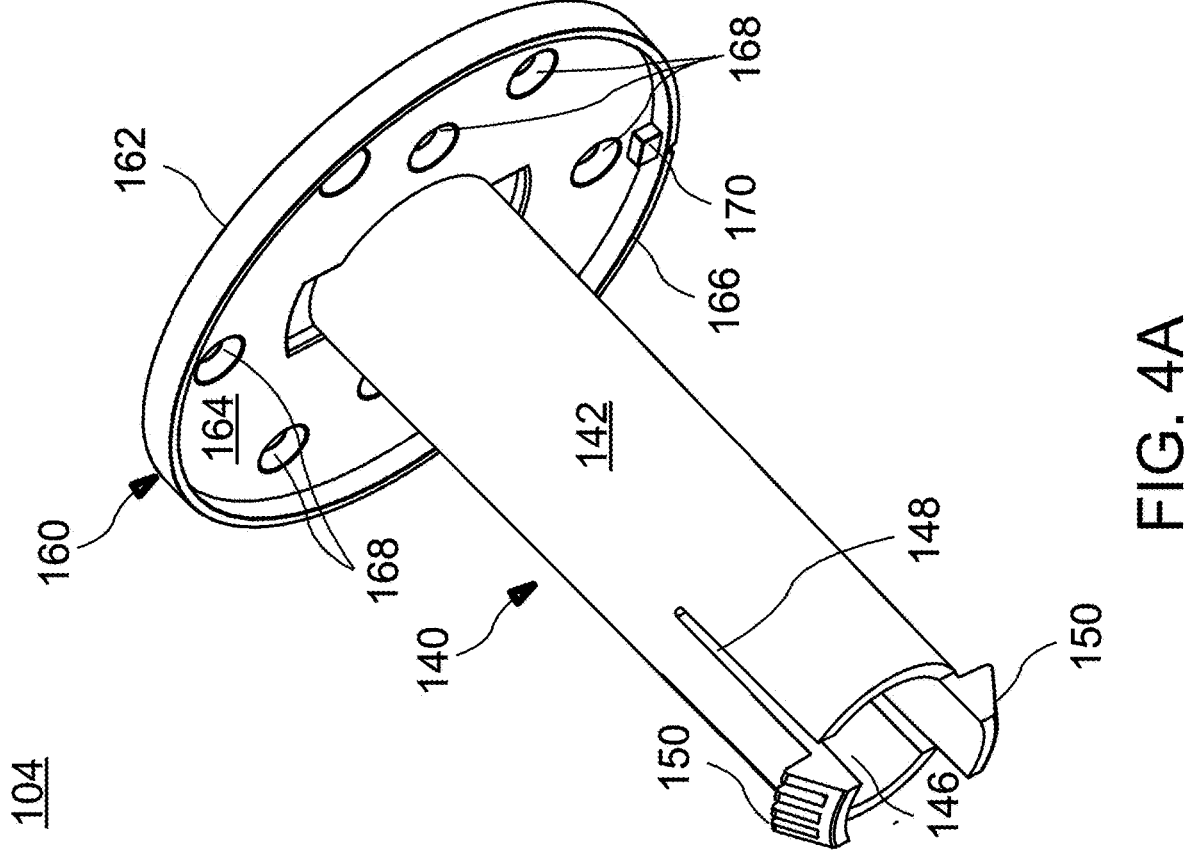
Figure 4C:
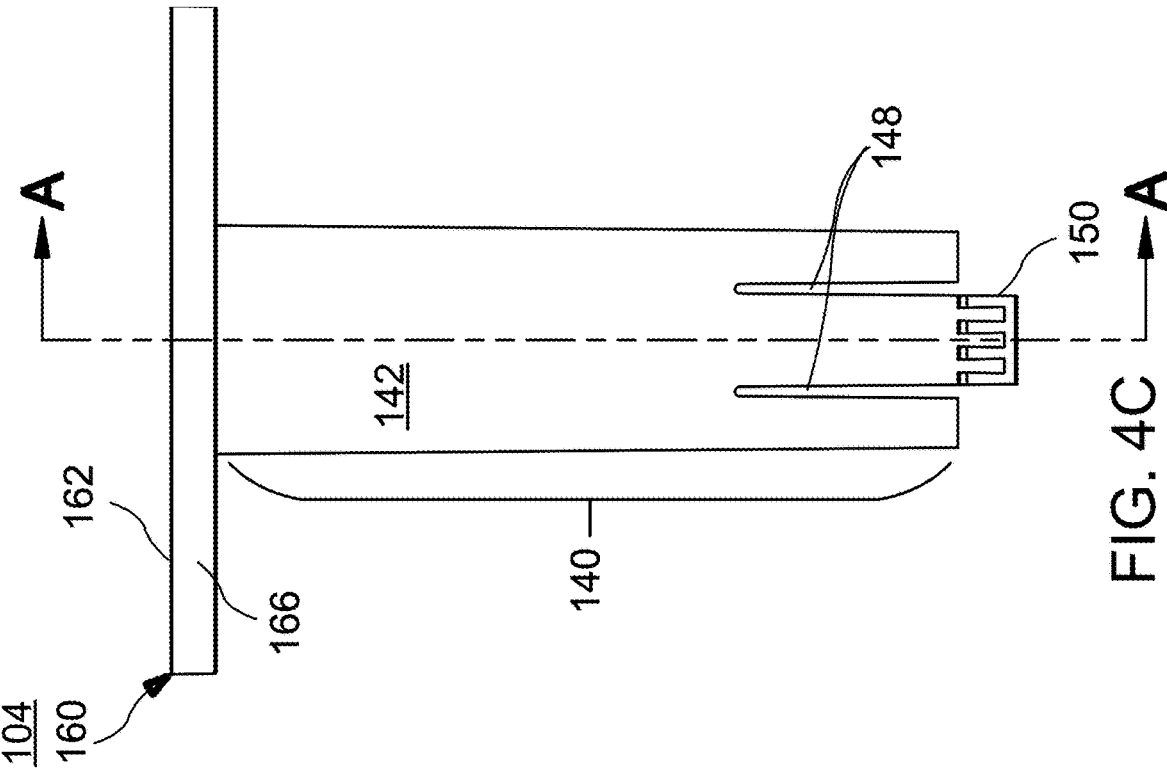
Figure 4B:
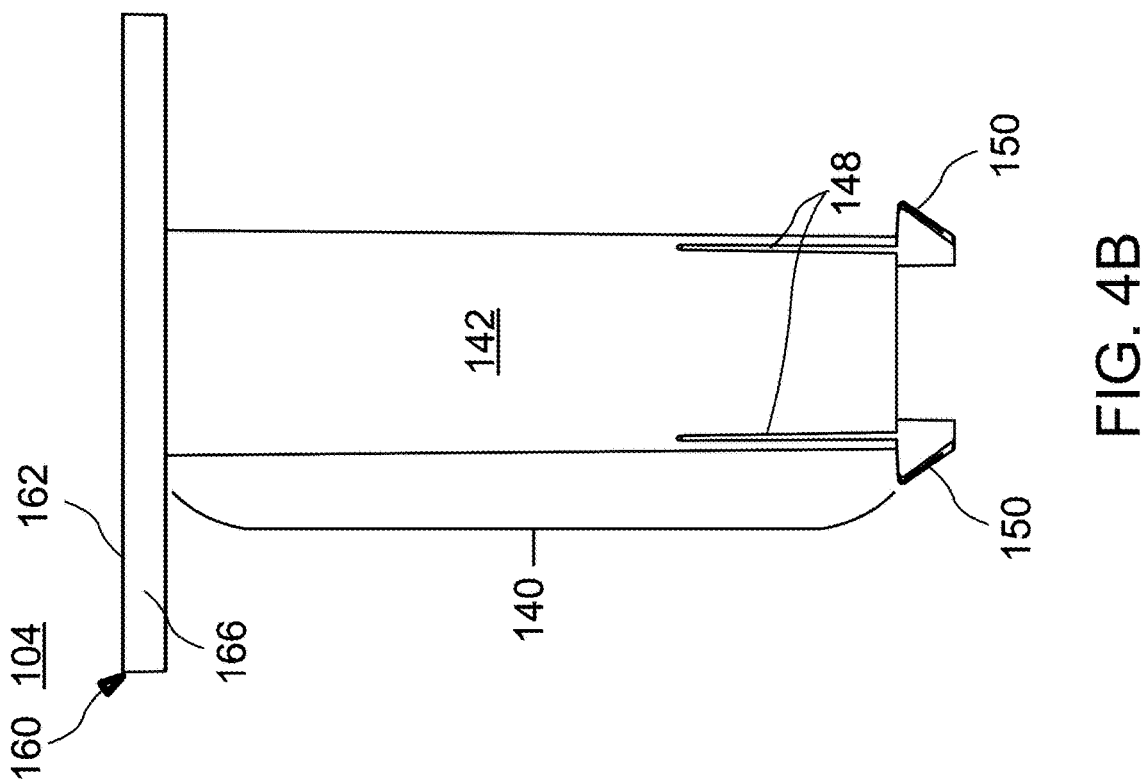
Figures 4D, 4E:
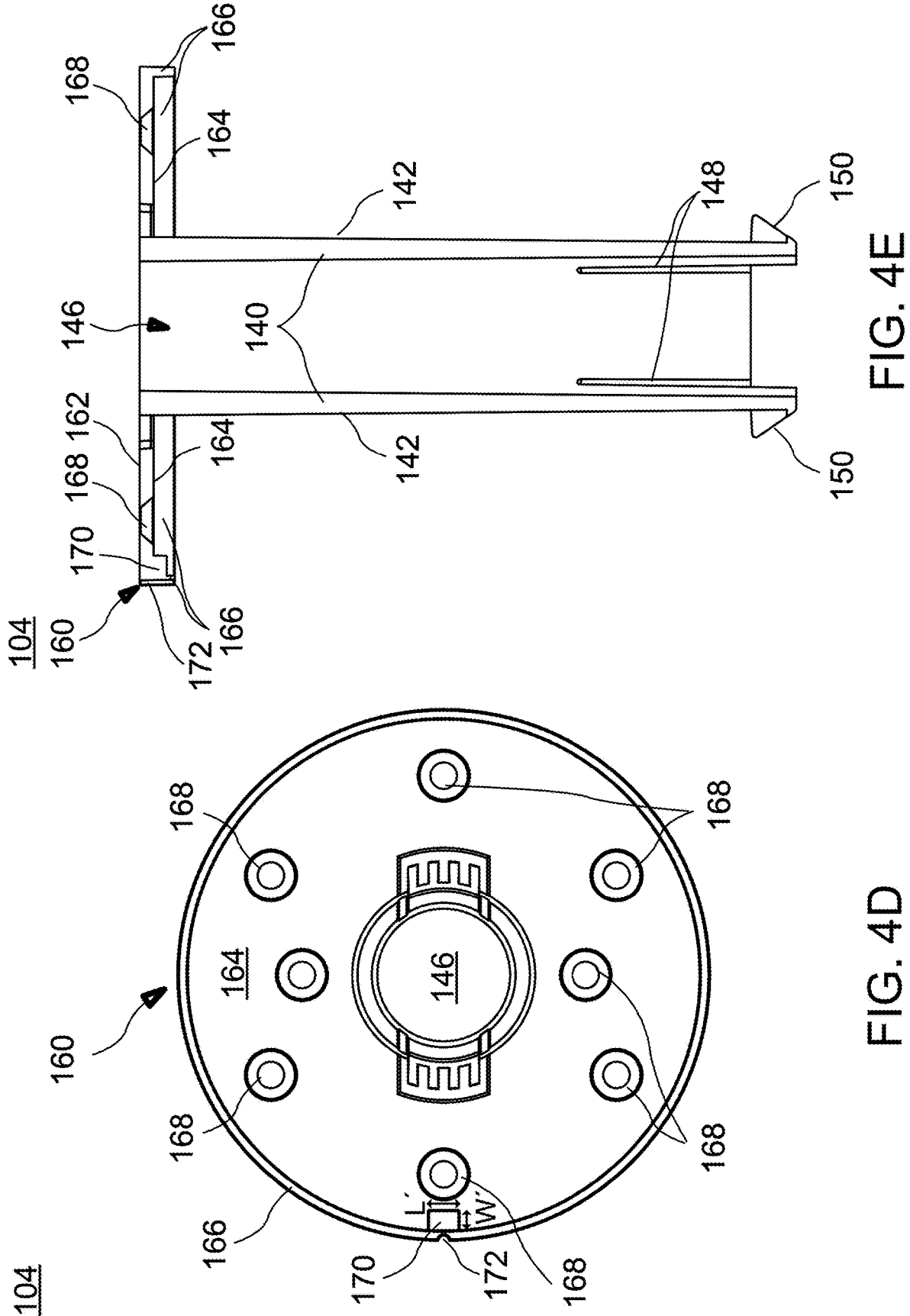

FIGS. 4A-4D are perspective, front elevation, side elevation, and bottom plan views, respectively, of a mounting flange or second insertable part of the swivel mount kit or assembly of FIGS. 1 and 2; and FIG. 4E is a cross-sectional view of the second insertable part taken along line A-A of the side view of FIG. 4C.

Figures 5A, 5B, 5C:
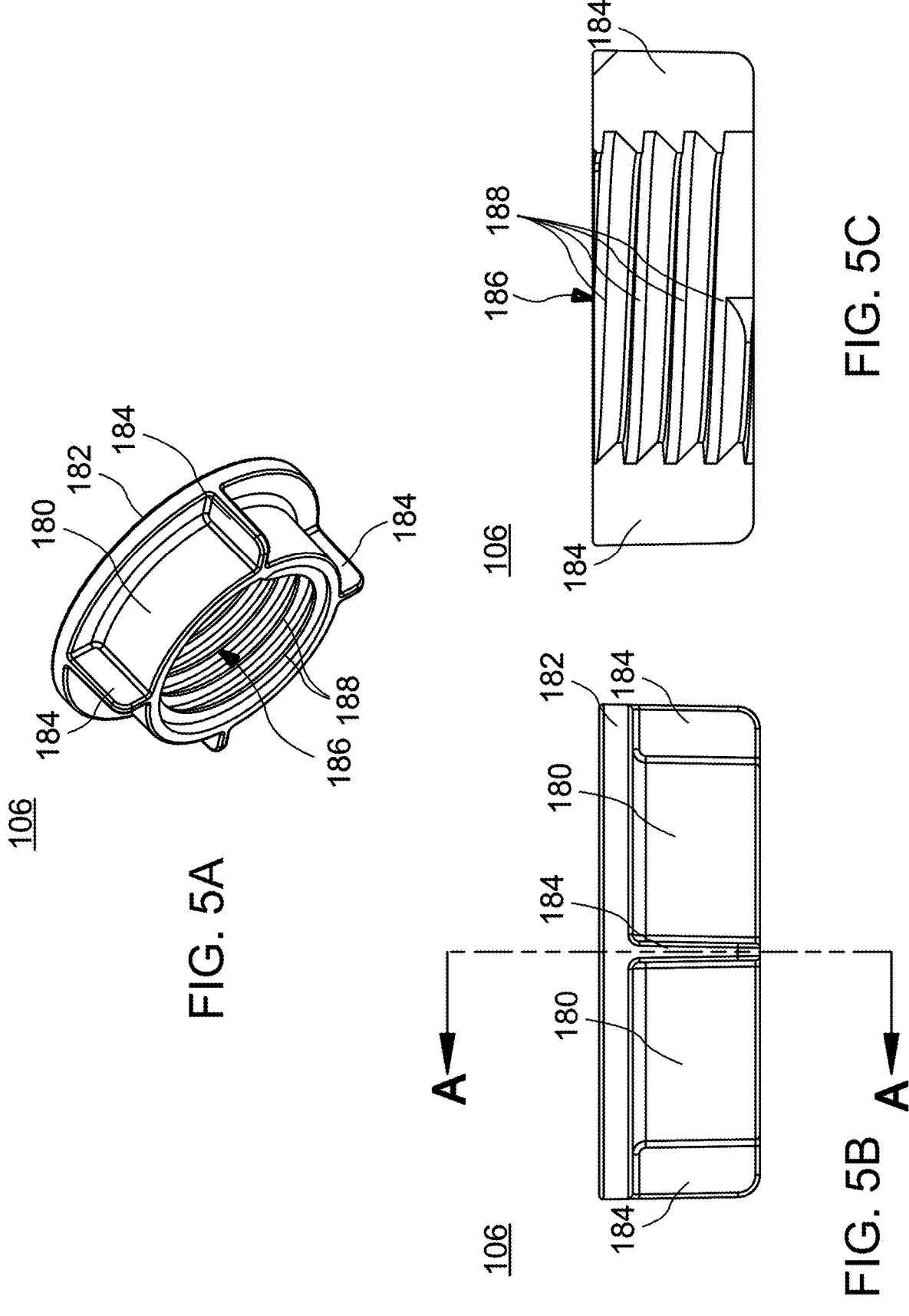

FIGS. 5A-5B are perspective and front elevation views, respectively, of a nut or securing part of the swivel mount kit or assembly of FIGS. 1 and 2; and FIG. 5C is a cross-sectional view of the securing part taken along line A-A of the front view of FIG. 5B.

FIGS. 6A-6E are front elevation, top perspective, bottom perspective, right side elevation, and left side elevation views, respectively, of the swivel mount kit or assembly of FIGS. 1 and 2 when assembled.

Figure 6A:
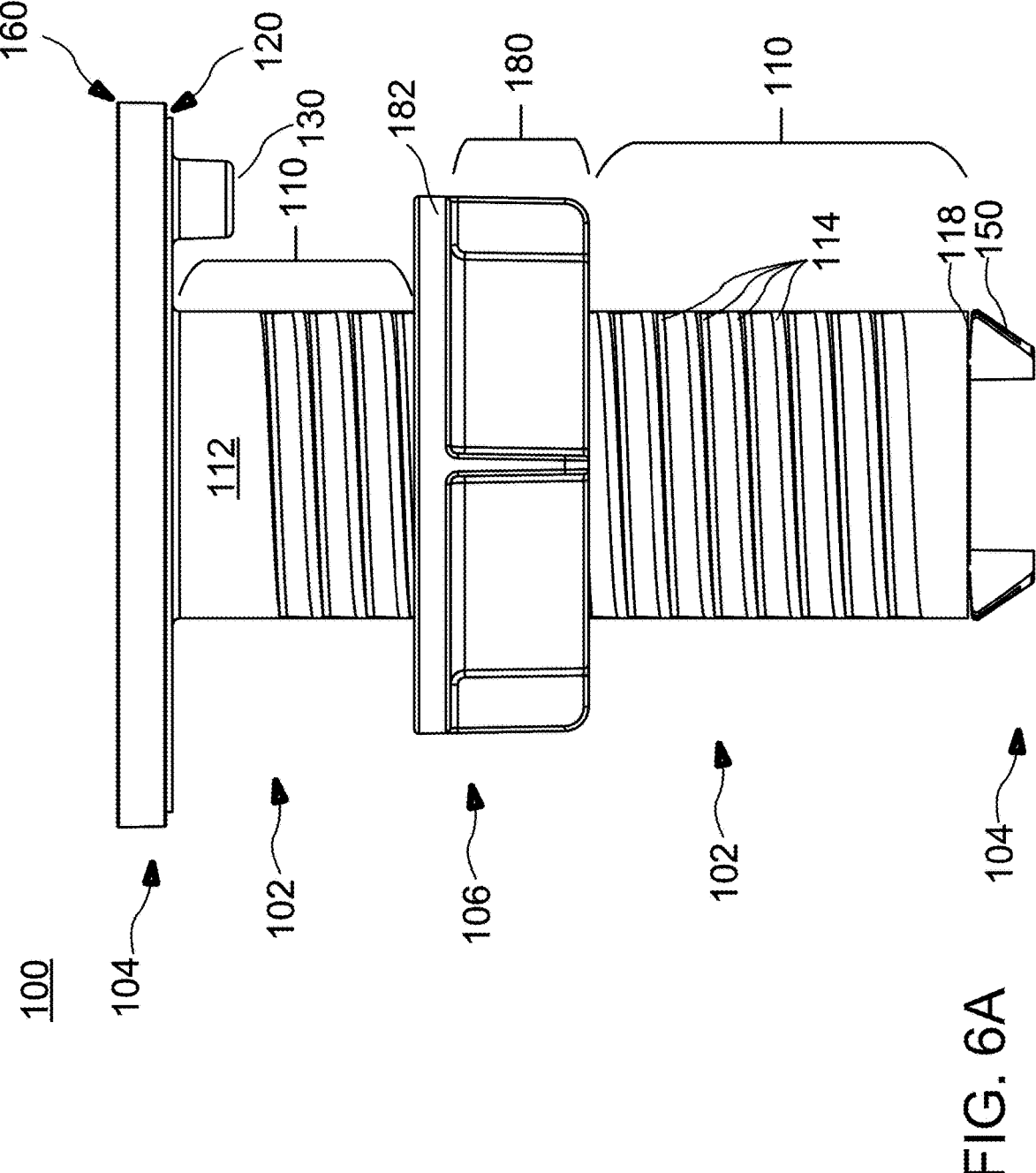
Figures 6B, 6C:
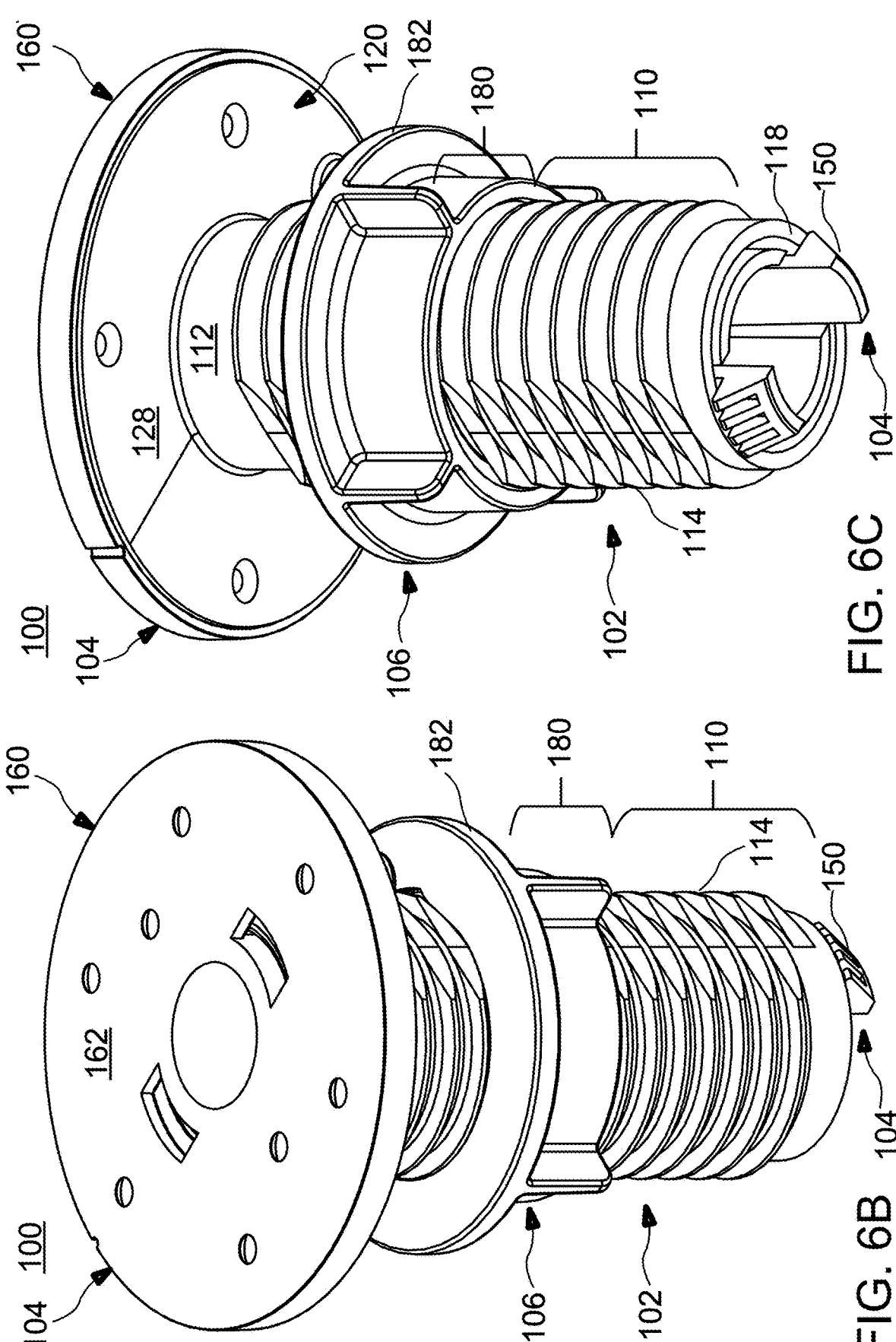
Figure 6E:
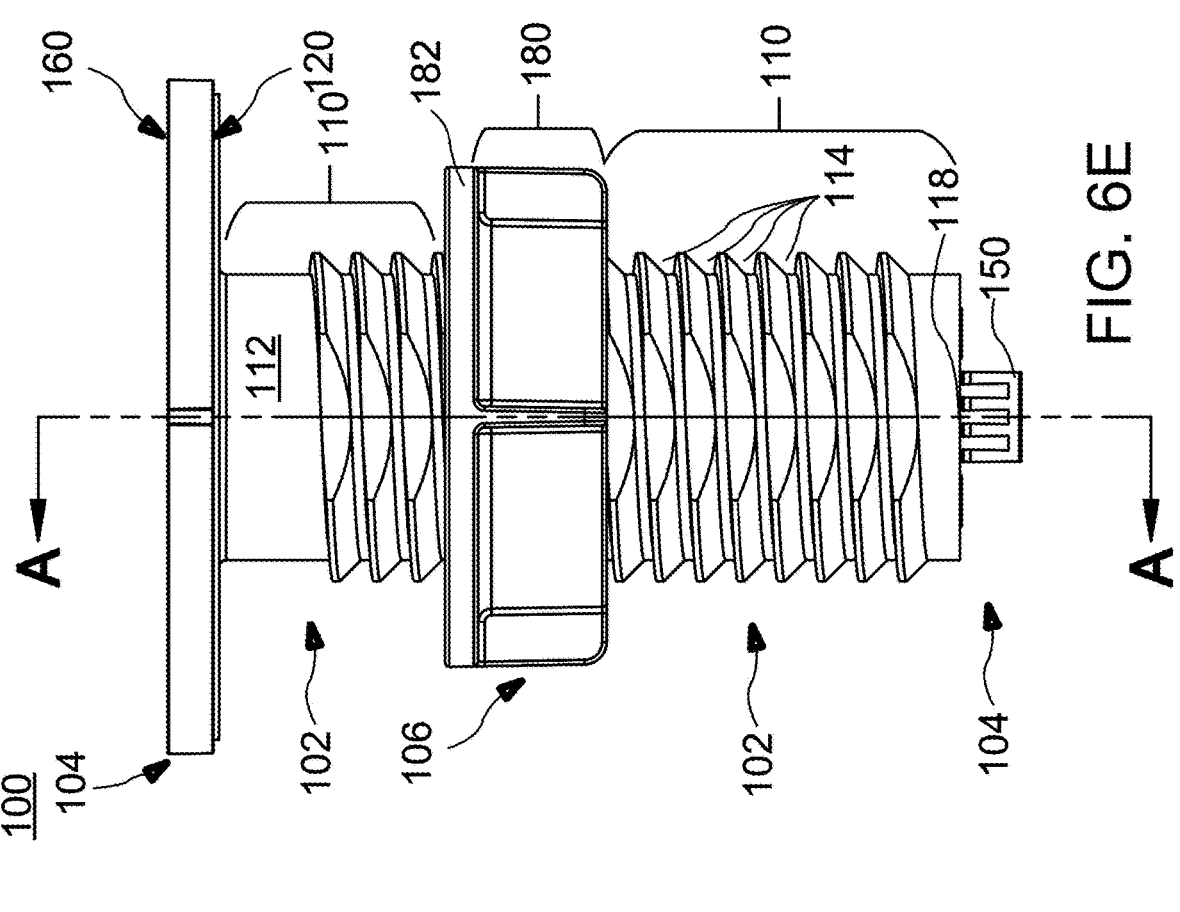
Figures 7A, 7B:
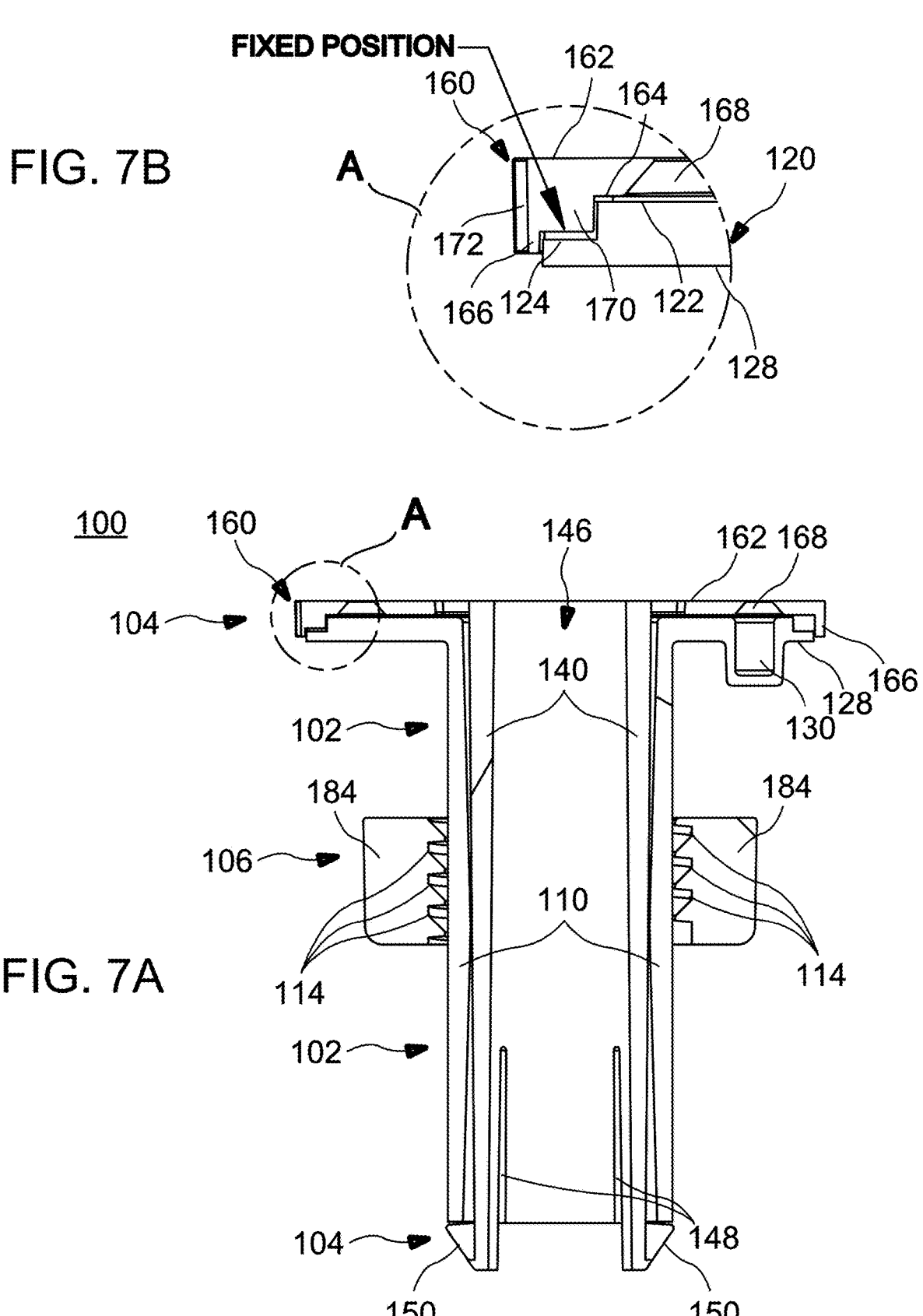

FIG. 7A is a cross-sectional view taken along line A-A of the left side elevation view of the assembled swivel mount kit or assembly of FIG. 6E with a block, pedestal, or other protrusion disposed in the "fixed position" or "locking position"; and FIG. 7B is an enlarged view of the region "A" of FIG. 7A.

Figures 8A, 8B:
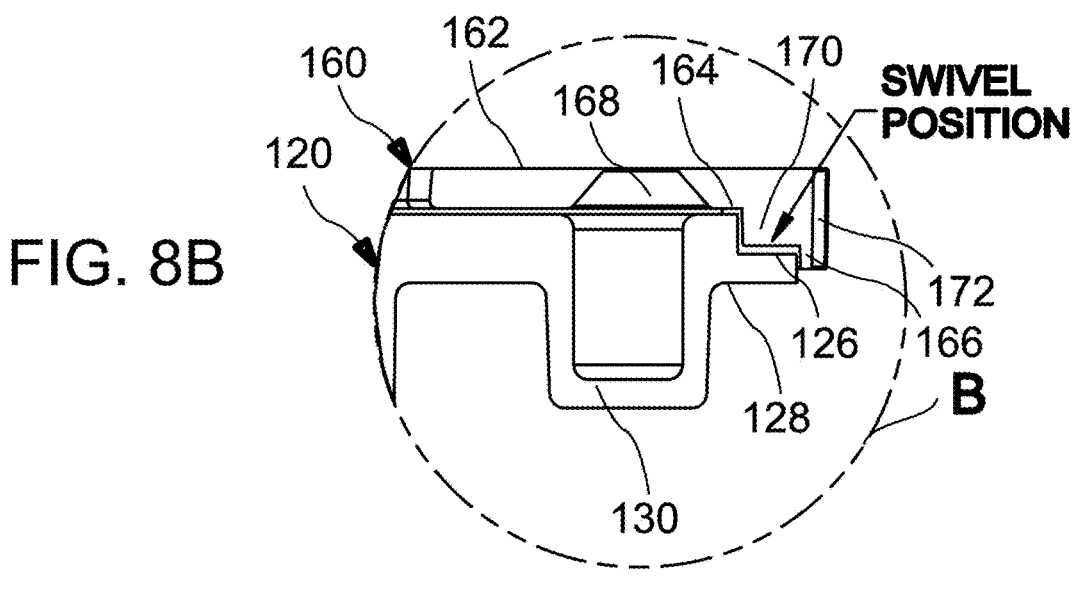

FIG. 8A is a cross-sectional view taken along line A-A of the left side elevation view of the assembled swivel mount kit or assembly of FIG. 6E with a block, pedestal, or other protrusion disposed in the "swivel position"; and FIG. 8B is an enlarged view of the region "B" of FIG. 8A.

Figure 9A:
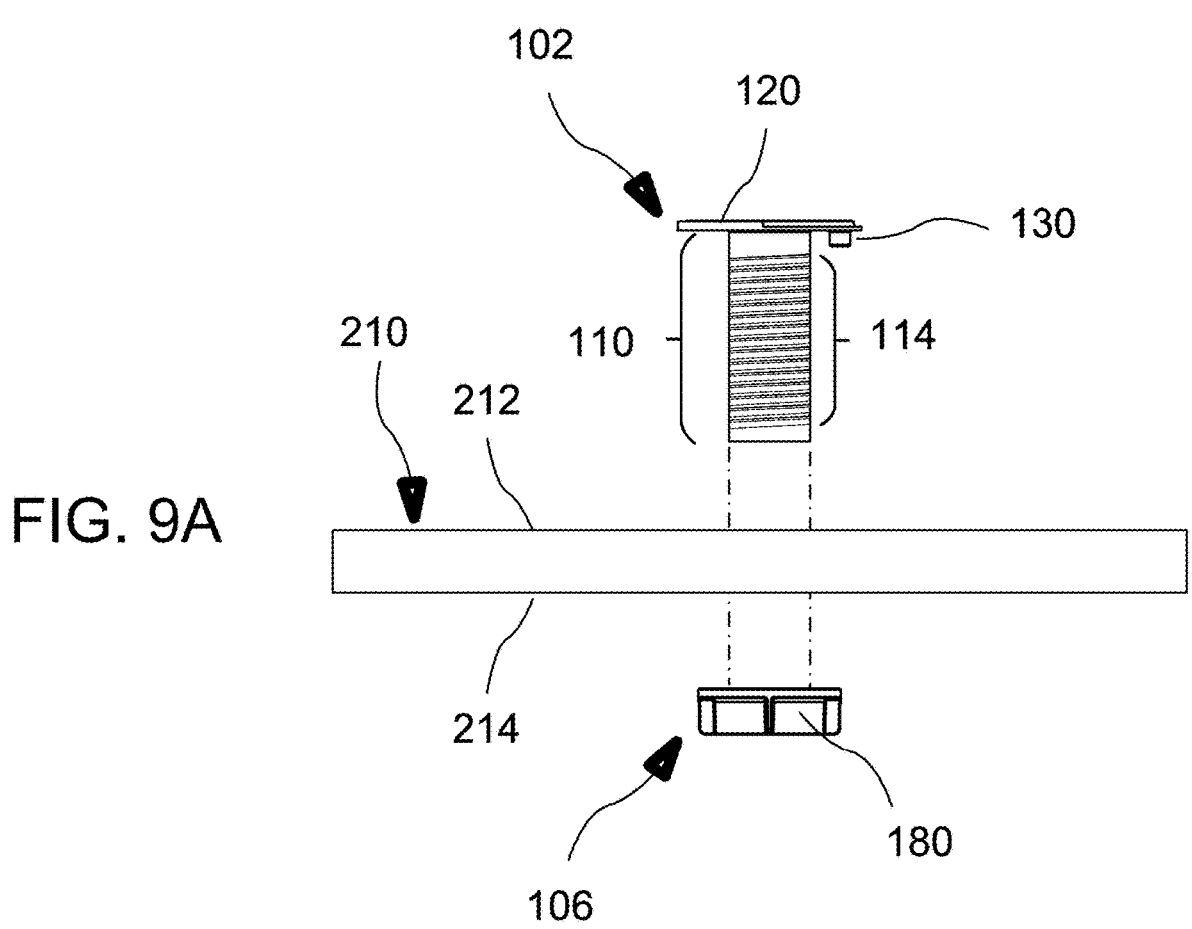
Figure 9B:
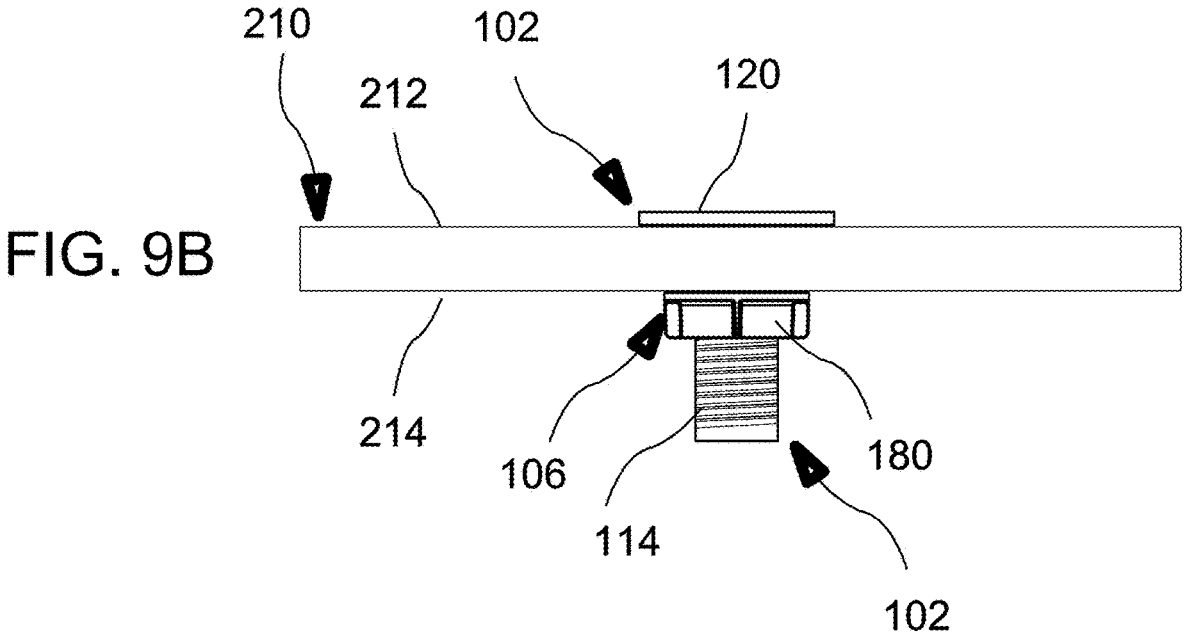
Figure 9C:
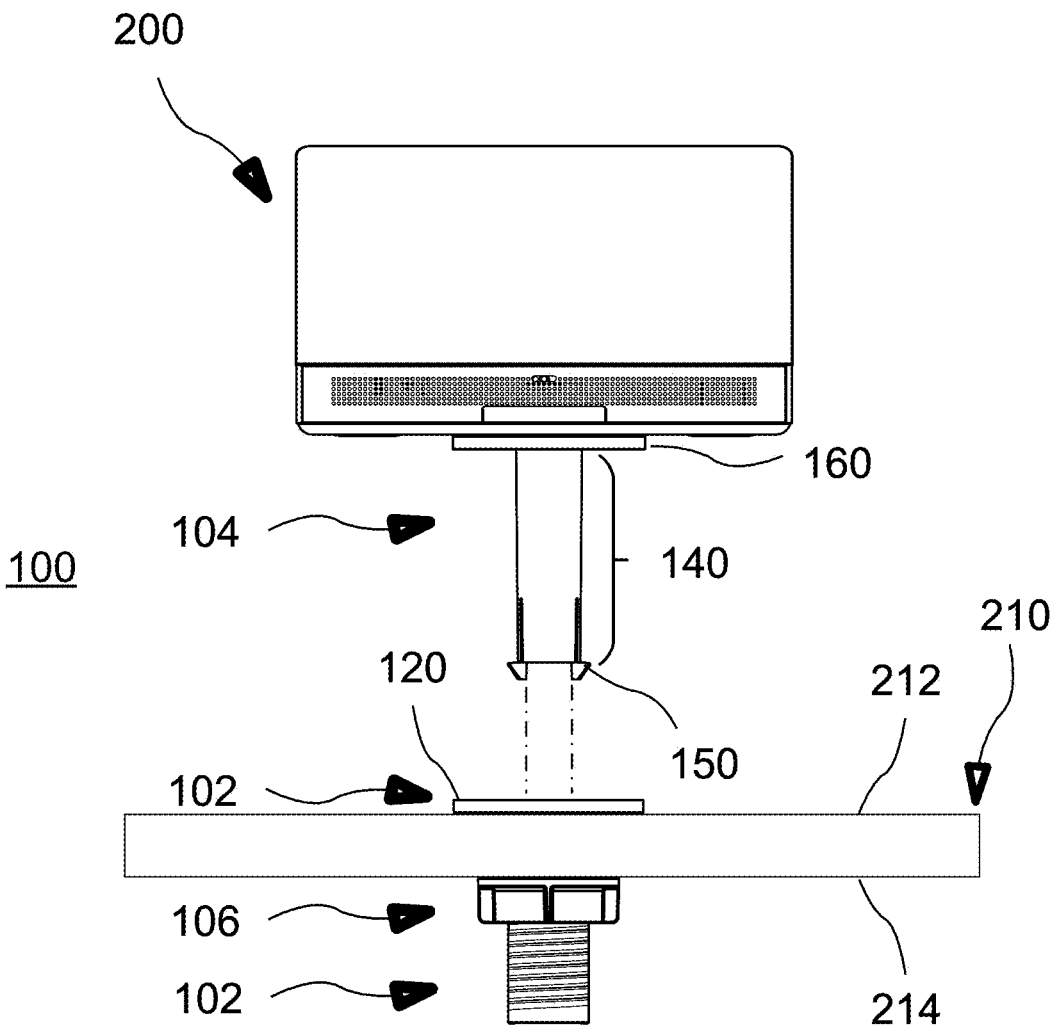
Figures 9D, 9E:
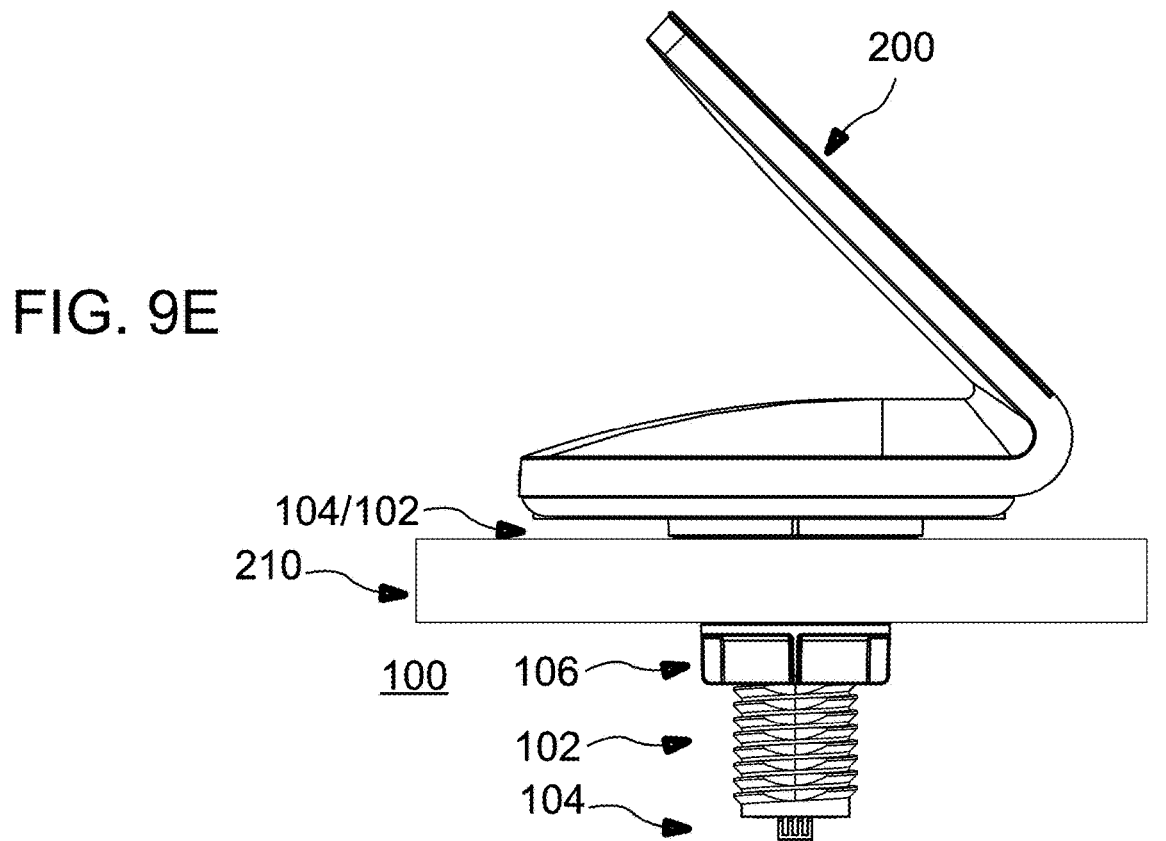

FIGS. 9A-9C depict an example of a mounting of the swivel mount kit or assembly of FIGS. 1 and 2 to a tabletop with an electronic device attached thereto; and FIGS. 9D and 9E are front and side views, respectively, of the swivel mount kit or assembly of FIGS. 1 and 2 and the electronic device mounted to the tabletop.

DETAILED DESCRIPTION OF THE INVENTION

The present embodiments provide a swivel mount kit or assembly for mounting an electronic device to a tabletop or other mounting structure in which the same kit or assembly is suitable for either mounting the electronic device at a fixed position mounting or movably mounting the electronic device.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

LIST OF REFERENCE NUMBERS FOR THE MAJOR ELEMENTS IN THE DRAWING

The following is a list of the major elements in the drawings in numerical order.

| 100 | Swivel Mount Kit or Assembly |
|-----|------------------------------|
| 102 | Threaded Bulkhead/First Insertable Part |
| 104 | Mounting Flange/Second Insertable Part |
| 106 | Nut/Securing Part |
| 110 | Cylindrical Body of First Insertable Part |
| 112 | Outer Wall of Cylindrical Body |
| 114 | Threads of Cylindrical Body |
| 116 | Central Opening of Cylindrical Body |
| 118 | Bottom Surface of Cylindrical Body |
| 120 | First Plate Part |
| 122 | Upper Surface of First Plate Part |
| 124 | Opening |
| 126 | Swivel Track |
| 128 | Lower Surface of First Plate Part |
| 130 | Boss-Shaped Element |
| 132 | Screw Holes |
| 140 | Elongated Body of Second Insertable Part |
| 142 | Outer Wall of Elongated Body |
| 146 | Central Opening of Elongated Body |
| 148 | Slots |
| 150 | Snap Protrusions |
| 160 | Second Plate Part |
| 162 | Upper Surface of Second Plate Part |
| 164 | Lower Surface of Second Plate Part |
| 166 | Perimeter Wall |
| 168 | Screw Holes |
| 170 | Block, pedestal, or other protrusion |
| 172 | Notch |
| 180 | Ring Part |
| 182 | Plate Part |
| 184 | Tabs |
| 186 | Central Opening |

-continued

| 188 | Threads |
|-----|---------|
| 200 | Electronic Device |
| 210 | Tabletop |
| 212 | Upper Surface of Tabletop |
| 214 | Lower Surface of Tabletop |

MODE(S) FOR CARRYING OUT THE INVENTION

The embodiment is described herein in the context of a swivel mount kit or assembly, but is not limited thereto, except as may be set forth expressly in the appended claims.

Referring first to FIG. 1, a swivel mount kit or assembly 100 for mounting an electronic device to a tabletop or other mounting structure is shown according to an embodiment. FIG. 1 is an exploded perspective view of the swivel mount kit or assembly 100, and FIG. 2 is an exploded front view of the swivel mount kit or assembly 100.

The swivel mount kit or assembly 100 includes a threaded bulkhead or first insertable part 102, a mounting flange or second insertable part 104, and a nut or securing part 106. The threaded bulkhead or first insertable part 102 includes a hollow, cylindrical body 110 having a first plate part 120 attached to one end of the cylindrical body 110. The mounting flange or second insertable part 104 includes an elongated body 140 having a second plate part 160 located at one end and a pair of snap protrusions 150 located at another, opposing end. The nut or securing part 106 includes a ring part 180 having a plate part 182 located at one end of the ring part 180.

Referring now to FIGS. 3A-3D, the threaded bulkhead or first insertable part 102 is shown in greater detail. Specifically, FIG. 3A is a perspective view of the first insertable part 102, FIG. 3B is a front elevation view, FIG. 3C is a top plan view, and FIG. 3D is a cross-sectional view taken along line B-B of the front elevation view of FIG. 3B.

The first insertable part 102 includes the hollow, cylindrical body 110 having an outer wall 112. A plurality of threads 114 are disposed on the outer wall 112 and cover at least part of the outer wall 112.

The first plate part 120 is attached to the one end of the cylindrical body 110. The first plate part 120 is typically circular shaped though other shapes, such as a rectangular or another shape, are also within the scope of the embodiment. A plurality of screw holes 132 may be provided and extend through the first plate part 120. The screw holes 132 may be used to receive threaded screws or bolts in some applications.

The first plate part 120 includes a lower surface 128 which faces the cylindrical body 110 and an upper surface 122 which faces away from the cylindrical body 110. An alignment feature may be attached to the lower surface 128 of the first plate part 120 and may be a circular-shaped element, such as boss-shaped element 130, though other shaped elements are also within the scope of the embodiment. Using the circular-shaped alignment element, however, provides an advantage that a corresponding opening in the tabletop or other mounting structure may be formed by drilling using a known drill bit.

With particular reference to FIG. 3C, the upper surface 122 of the first plate part 122 includes a curved track 126 and an opening 124 which are each formed at a predefined depth within the upper surface 122. The curved track 126 has a predefined width W. When the first plate part 120 is circular shaped, the curved track 126 may be formed along a portion of a perimeter of the first plate part 120, such as along an arc of 188°. Alternatively, the curved track 126 may be formed at a distance inward from the perimeter of the first plate part 120. For example, the curved track 126 may be formed along a portion of an imaginary circle that is defined in the plane of the upper surface 122 and which may be concentric with the first plate part 120. When the first plate part 120 is of a non-circular shape, the curved track 126 may be formed in a similar manner along a predefined portion of such an imaginary circle.

The opening 124 has a predefined width W and a predefined length L. When the curved track 126 is formed along the portion of the perimeter of the first plate part 120, the opening 124 is also formed on the perimeter at a location other than where the curved track 126 is located. Alternatively, when the curved track 126 is formed along the portion of the imaginary circle, the opening 128 is also located on the imaginary circle at a location where the curved track 126 is not located.

Though the opening 124 is depicted as a rectangular shaped opening, other configurations and shapes are also within the scope of the embodiment. As an example, the opening 124 may be a circular opening having a diameter D. Further, the diameter D of the opening 124 may have the same value as the width W of the curved track 126.

The first insertable part 102 also includes a central opening 116. As FIGS. 3C and 3D show, the central opening 116 extends through the first plate part 120 and through the entire length of the cylindrical body 110, namely, from the one end of the cylindrical body 110 to the another end thereof. At the another end of the cylindrical body 110, the central opening 116 is surrounded by a bottom surface 118.

Turning now to FIGS. 4A-4D, the mounting flange or second insertable part 104 is shown in greater detail. Specifically, FIG. 4A is a perspective view of the second insertable part 104, FIG. 4B is a front elevation view, FIG. 4C is a side elevation view, FIG. 4D is a bottom plan view, and FIG. 4E is a cross-sectional view taken along line A-A of the front view of FIG. 4C.

The second insertable part 104 includes the elongated body 140 having an outer wall 142. The second plate part 160 is attached to the one end of the elongated body 140 and is typically circular shaped though other shapes, such as a rectangular shape or another shape, are also within the scope of the embodiment. The second plate part 160 includes an upper surface 162 which faces away from the elongated body 140 and a lower surface 164 which faces the elongated body 140. A perimeter wall 166 may surround the lower surface 164.

The second insertable part 104 is typically hollow, having a central opening 146 which extends through the second plate part 160 and through the entire length of the elongated body 140, namely, from the one end of the elongated body 140 to another end thereof. A plurality of screw holes 168 extend through the second plate part 160. The screw holes 168 may be used, for example, to receive threaded screws or bolts for securing an electronic device to the second plate part 160 of the second insertable part 104.

The pair of opposing snap protrusions 150 are attached to the another end of the elongated body 140 and are face outward from the outer wall 142 of the elongated body 140. A slot 148 is provided on each side of each snap protrusion 150. Each slot 148 extends through the thickness of the elongated body 140 from the outer wall 142 to the central opening 146. The pair of slots 148 adjacent to a given snap protrusion 150 permit that snap protrusion 150 to have a limited range of inward or outward movement.

Referring back to FIGS. 1 and 2, the broken lines between the first insertable part 102 and the second insertable part 104 show the manner in which the elongated body 140 of the second insertable part 104 is insertable into the central opening 116 in the cylindrical body 110 in the first insertable part 102. When the another end of the elongated body 140 is first inserted into the central opening 116, the inner walls of the cylindrical body 110 direct the snap protrusions 150 away from the inner walls of the cylindrical body 110 and toward the center of the central opening 116. As the elongated body 140 is further moved through the central opening 116, the snap protrusions 150 move along the central opening 116 until the snap protrusions 150 move past the bottom surface 118 at the another end of the cylindrical body 110. The snap protrusions 150 then snap outward and extend away from the outer wall 142 of the elongated body 140 and hold the second insertable part 104 in place against the first insertable part 102.

As the elongated body 140 of the second insertable part 104 is being moved along the central opening 116 in the first insertable part 102, the lower surface 164 of the second plate part 160 of the second insertable part 104 is being brought near the upper surface 122 of the first plate part 120 of the first insertable part 102. Then, as the elongated body 140 is further moved through the central opening 116 and the snap protrusions 150 exit the central opening 116, the lower surface 164 of the second plate part 160 is brought into contact with the upper surface 122 of the first plate part 120.

The lower surface 164 of the second plate part 160 is shown in greater detail in FIGS. 4D and 4E and includes a block, pedestal, or other protrusion 170 which extends away from the lower surface 164. The block or pedestal 170 has a width W' that is slightly smaller than the width W of the opening 124 in the upper surface 122 of the first plate part 120 shown in FIG. 3C and is also slightly smaller than the width W of the curved track 126 in the upper surface 122. The block or pedestal 170 also has a length L' that is slightly smaller than the length L of the opening 124 in the upper surface 122 of the first plate part 120.

The location of the block or pedestal 170 on the upper surface 162 of the second plate part 160 is reliant on the location of the opening 124 of the first plate part 120 and the location of the curved track 126 of the first plate part 120 shown in FIG. 3C. That is, the locations of the block or pedestal 170, the opening 124, and the curved track 126 are each selected such that when the lower surface 164 of the second plate part 160 and the upper surface 122 of the first plate part 120 are brought near each other, a determination of whether the block or pedestal 170 is to be inserted into the opening 124 or into a location along the curved track 126 can be made by merely rotating the second plate part 160. For example, if the opening 124 and the curved track 126 are located on the perimeter of the first plate part 120, the block or pedestal 170 should directly face the perimeter of the first plate part 120 when the lower surface 164 of the second plate part 160 and the upper surface 122 of the first plate part 120 are brought near each other. With the block or pedestal 170, the opening 124, and the curved track 126 arranged in this manner, the block or pedestal 170 is insertable into the opening 124 and into any location on the curved track 126 when the lower surface 164 of the second plate part 160 is brought into contact with the upper surface 122 of the first plate part 120.

Alternatively, if the opening 124 and the curved track 126 are located on the imaginary circle of the first plate part 120, the block or pedestal 170 should directly face the imaginary circle of the first plate part 120 when the lower surface 164 of the second plate part 160 and the upper surface 122 of the first plate part 120 are brought near each other. With the block or pedestal 170, the opening 124, and the curved track 126 arranged in such a manner, the block or pedestal 170 is insertable into the opening 124 and into any location on the curved track 126 when the lower surface 164 of the second plate part 160 is brought into contact with the upper surface 122 of the first plate part 120.

When the block or pedestal 170 of the second plate part 160 is inserted into the opening 124 of the first plate part 120, the block or pedestal 170 is described as being disposed in a "locking position" in which the position of the second insertable part 104 is fixed (with respect to the first insertable part 102). Alternatively, when the block or pedestal 170 of the second plate part 160 is located on the curved swivel track 126 of the first plate part 120, the block or pedestal 170 is described as being disposed in a "swivel position" in which the second insertable part 104 is movable within a range of angles determined by the size of the arc of the curved swivel track 126.

To assist in positioning the block or pedestal 170 for insertion into either the opening 124 or the curved track 126, a notch 172 is provided on the outside of the perimeter wall 166 of the second plate part 160 at a location on the perimeter wall 166 that is nearest to the block or pedestal 170. Typically, when the lower surface 164 of the second plate part 160 and the upper surface 122 of the first plate part 120 are brought near each other, the location of the block or pedestal 170 may be obscured by the downward-facing lower surface 164 of the second plate part 160 and by the surrounding perimeter wall 166. Thus, the notch 172 provides an indication of the position of the block or pedestal 170 and may be used to guide movement of the block or pedestal 170 toward the opening 124 or the curved track 126.

To subsequently separate the second insertable part 104 from the first insertable part 102, the snap protrusions 150 must be manually pushed inward toward the center of the central opening 116 until the snap protrusions 150 pass the inner walls of the cylindrical body 110 of the first insertable part 102. While the snap protrusions 150 are manually held inward, the second insertable part 104 may begin to be withdrawn from the first insertable part 102.

FIGS. 5A-5C show the nut or securing part 106 in greater detail. Specifically, FIG. 5A shows a perspective view of the nut or securing part 106, FIG. 5B shows a front elevation view, and FIG. 5C shows a cross-sectional view taken along line A-A of the front view of FIG. 5B.

Referring now to FIGS. 5A and 5B, the securing part 106 includes a ring part 180, a plate part 182 which is attached to one end of the ring part 180, and a plurality of tabs 184 which extend outward from the sides of the ring part 180. A central opening 186 extends through the depth of the ring part 180 and through the plate part 182 and has threads 188 formed thereon. The threads 188 are configured to be "mateable" with the threads 114 of the cylindrical body 110 of the first insertable part 102.

Referring again to FIGS. 1 and 2, the broken lines shown between the first insertable part 102 and the securing part 106 show the manner in which the securing part 106 is connectable with the cylindrical body 110 of the first insertable part 102. The bottom surface 118 of the cylindrical body 110 of the first insertable part 102 may be inserted into the central opening 186 of the securing part 106, or alternatively, the ring part 180 of the securing part 106 may be slid onto the another end of the cylindrical body 110 of the first insertable part 102. Then, the inner threads 188 of the securing part 106 may be brought into contact with the threads 114 on the outer wall 112 of the cylindrical body 110. The securing part 106 may then be rotated about the cylindrical body 110 so that the securing part 106 traverses away from the bottom surface 118 of the cylindrical body 110 and toward the first plate part 120.

The securing part 106 may be used to secure the first insertable part 102 to a tabletop or other mounting structure. For example, the another end of the cylindrical body 110 of the first insertable part 102 may be inserted into an opening in the tabletop or other mounting structure opening and then the remainder of the cylindrical body 110 passed through the opening until the lower surface 128 of the first plate part 120 contacts an upper surface of the tabletop or other mounting structure. The ring part 180 of the securing part 106 is then slid onto the another end of the cylindrical body 110, which rests below a lower surface of the tabletop or other mounting structure, and the inner threads 188 of the central opening 186 of the securing part 106 are brought into contact with the threads 114 on the outer wall 112 of the cylindrical body 110. Next, the securing part 106 is turned and traverses along the cylindrical body 110 until the ring part 182 of the securing part 106 contacts and begins to press against the lower surface of the tabletop or other mounting structure. This pressing also pulls the lower surface 128 of the first plate part 120 against the upper surface of the tabletop or other mounting structure. As a result of the nut or securing part 106 pressing against the lower surface of the tabletop or other mounting structure and the first plate part 120 pressing against the upper surface of the tabletop or other mounting structure, the first insertable part 102 is secured to the tabletop or other mounting structure.

Then, the elongated body 140 of the second insertable part 104 is inserted into the central opening 116 of the first insertable part 102 in the manner described above, until the snap protrusions 150 of the elongated body 140 abut against the bottom surface 118 of the cylindrical body 110 and secure the second insertable part 104 to the first insertable part 102. As a result, the second insertable part 104 is also secured to the tabletop or other mounting structure so that the entire swivel mount kit or assembly 100 is now mounted to the tabletop or other mounting structure.

Prior to securing the second insertable part 104 to the first insertable part 102, an electronic device may be secured to the second insertable part 104. A plurality of threaded screws or bolts may be driven through the plurality of screw holes 168 formed in the second plate part 160 of the second insertable part 104 to affix the electronic device to the second plate part 160. The securing of the second insertable part 104 to the first insertable part 102 thus also secures the electronic device to the first insertable part 102 and thereby mounts the electronic device to the tabletop or other mounting structure.

The central opening 146 of the second insertable part 104 may be used to route cables, such as power and/or data wiring, that extend from the electronic device. The wiring that is routed through the central opening 146 may then pass beneath the tabletop or other mounting structure to hide the wiring.

FIGS. 6A-6E show the first insertable part 102, the second insertable part 104, and the securing part 106 combined together in the manner described above to form an assembled swivel mount kit or assembly 100. For illustrative purposes, the assembled swivel mount kit or assembly 100 is shown without the tabletop or other mounting structure.

Figure 6D:
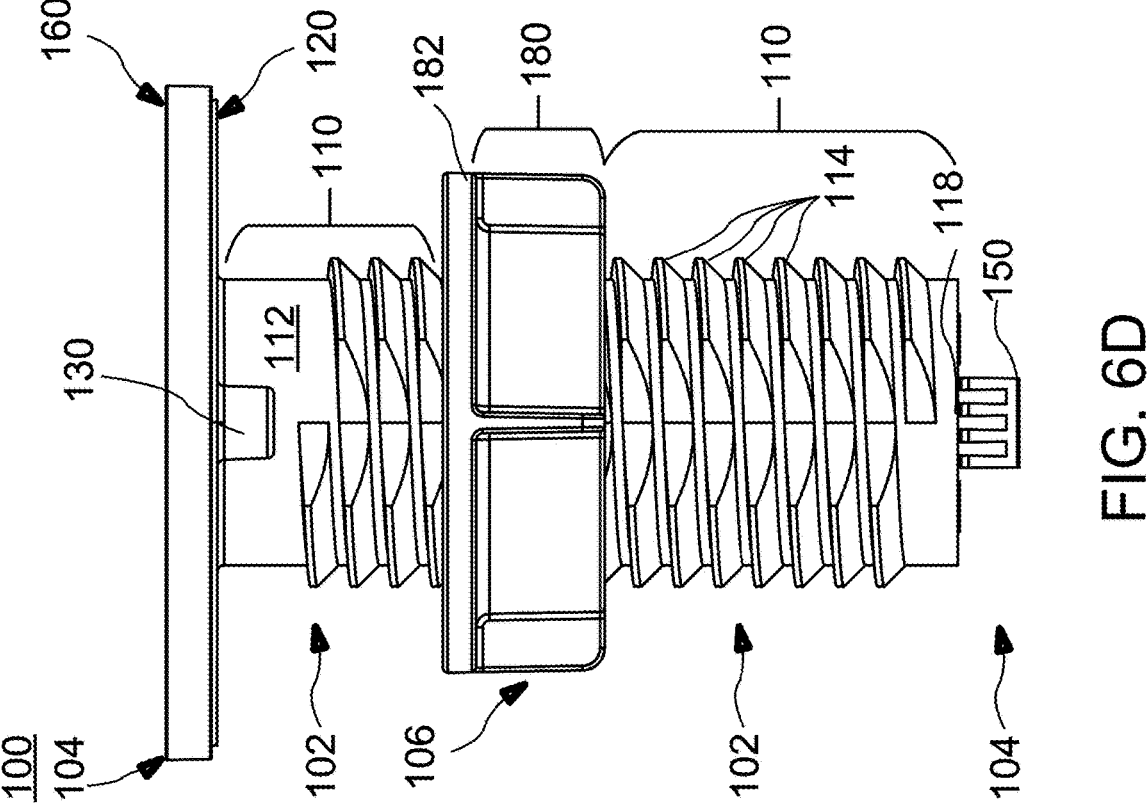

More specifically, FIG. 6A shows a front elevation view of the assembled swivel mount kit or assembly 100, FIG. 6B shows a top perspective view, FIG. 6C shows a bottom perspective view, FIG. 6D shows a right side elevation view, and FIG. 6E shows a left side elevation view.

FIGS. 7A and 8A are cross-sectional views of the assembled swivel mount kit or assembly 100 taken along line A-A of the left side elevation view of FIG. 6E, with FIG. 7B showing an enlarged view of region "A" of FIG. 7A, and FIG. 8B showing an enlarged view of region "B" of FIG. 8A.

Specifically, FIGS. 7A and 8A are each cross-sectional views showing the first insertable part 102, the second insertable part 104, and the securing part 106 assembled together. The elongated body 140 of the second insertable part 104 is disposed inside the central opening 116 of the cylindrical body 110 of the first insertable part 102. At the one end of the elongated body 140, the lower surface 164 of the second plate part 160 of the second insertable part 104 rests atop the upper surface 122 of the first plate part 120 of the first insertable part 102. The first plate part 120 is located at the one end of the cylindrical body 110 of the first insertable part 102. At the another end of the elongated body 140, the snap protrusions 150 of the elongated body 140 extend outward and abut against the bottom surface 118 of the cylindrical body 110.

The securing part 106 surrounds part of the outer wall 112 of the cylindrical body 110 of the first insertable part 102. The threads 188 on the central opening 186 of the securing part 106 are in contact with a portion of the threads 114 on the outer wall 112. For illustrative purposes, only the contacting portion of the threads 114 are shown.

FIGS. 7A and 7B, however, differ from FIGS. 8A and 8B in where the block, pedestal, or other protrusion 170 is positioned. Specifically, FIGS. 7A and 7B show the block, pedestal, or other protrusion 170 disposed in the opening 124 of the upper surface 122 of the first plate part 120. That is, the block, pedestal, or other protrusion 170 is disposed in the "fixed position" or "locking position". Typically, the opening 124 has substantially the same shape and dimensions as the block, pedestal, or other protrusion 170. As an example, a rectangular block, pedestal, or other protrusion having length L' and width W' may be disposed in an opening having a length L slightly greater than L' and a width W slightly greater than W'. Alternatively, a circular pillar having diameter D' may be disposed in an opening having a diameter D slightly greater than D'. As a result, the block, pedestal, or other protrusion 170 is fixed in position, and the elongated body 140 of the second insertable part 104 is likewise fixed in position with respect to the first insertable part 102.

By contrast, FIGS. 8A and 8B show the block, pedestal, or other protrusion 170 disposed in the swivel track 126 in the upper surface 122 of the first plate part 120. Namely, the block, pedestal, or other protrusion 170 is disposed in the "swivel position". Typically, the swivel track 126 has a width W at least as large or slightly larger than the width W' or diameter D' of the block, pedestal, or other protrusion 170 so that the block, pedestal, or other protrusion 170 will fit into any location along the swivel track 126. Moreover, because the swivel track 126 is configured to be concentric with the axis of rotation of the first insertable part 102 when inserted into the second insertable part 104, the block, pedestal, or other protrusion 170 is movable to any location along the swivel track 126. As a result, the range of rotation of the first insertable part 102 when the block, pedestal, or other protrusion 170 is in the "swivel position" is determined by the degrees of arc of the swivel track 126.

FIGS. 9A-9E depict an example of the mounting of an electronic device 200 to a tabletop 210 using the first insertable part 102, the second insertable part 104, and the securing part 106 of the swivel mount kit or assembly 100 according to an embodiment.

As FIG. 9A shows, a tabletop 210 includes an upper surface 212, a lower surface 214, and an opening that may be configured to receive the cylindrical body 110 of the first insertable part 102. Preferably, a circular opening is provided and may be produced using a drill and a drill bit. Another, smaller auxiliary opening may be provided for positioning the electronic device 200 and the swivel mount kit or assembly 100 on the tabletop 210. The smaller auxiliary opening is configured to receive the circular alignment element 130 and may be produced using a drill and another, smaller drill bit.

Next, as FIG. 9B shows, the cylindrical body 110 of the first insertable part 102 is inserted into the opening in the tabletop 210 at the upper surface 212. The cylindrical body 110 passes through the opening until the first plate part 120 rests atop the upper surface 212 with a remainder of the cylindrical body 110 extending past the lower surface 214. Then, the ring part 180 of the securing part 106 is slid onto the cylindrical body 110 of the first insertable part 102, and the threads 188 of the securing part 106 are brought into contact with the threads 114 the cylindrical body 110. The securing part 106 is then rotated about the cylindrical body 110 until the plate part 182 of the securing part 106 presses against the lower surface 214 of the tabletop 210 and pulls on the first plate part 120 and causes the first plate part 120 to press against the upper surface 212 of the tabletop 210 to secure the first insertable part 102 to the tabletop 210. The pressing of the securing part 106 against the lower surface 214 of the tabletop 210 and the pressing of the first plate part 120 against the upper surface 212 of the tabletop 210 secure the first insertable part 102 to the tabletop 210. In this manner, the first insertable part 102 is mounted to the tabletop 210.

Then, as shown in FIG. 9C, the elongated body 140 of the second insertable part 104 is inserted into the central opening 116 of the cylindrical body 110 of the first insertable part 102. As the elongated body 140 is inserted into the central opening 116 of the cylindrical body 110, the snap protrusions 150 are pushed inward toward the center of the central opening 116.

Prior to the insertion, an electronic device 200, which may be a touchscreen, is attached to the second plate part 160 of the second insertable part 104, such as using the bolts and the screw holes 168 formed in the second plate part 160. Though a touchscreen is depicted, other types of electronic devices may be used.

As the elongated body 140 is advanced through the central opening 116 of the cylindrical body 110, the snap protrusions 150 remain pushed inward toward the center of the central opening 116 until the snap protrusions 150 pass the bottom surface 118 of the cylindrical body 110. The snap protrusions 150 then snap outward, as shown in FIG. 9D, and inhibit removal of the second insertable part 104 and the electronic device 200 so that the second insertable part 104 is now mounted to the first insertable part 102. As a result, the electronic device 200 and the swivel mount kit or assembly 100 are now also mounted to the tabletop 210.

Either prior to, or concurrent with, the initial insertion of the elongated body 140 into the central opening 116, or while the elongated body 140 is being advanced through the central opening 116, the second plate part 160 is turned so that the block, pedestal, or other protrusion 170 will be in the "locking position" or in the "swivel position" when the lower surface 164 of the second plate part 160 contacts the upper surface 122 of the first plate part 120

FIG. 9E shows a side elevation view of electronic device 200 and the swivel mount kit or assembly 100 mounted to the tabletop 210.

In this manner, a swivel mount kit or assembly 100 is provided that enables various electronic devices to be mounted to a tabletop, desktop, or other mounting structure. The swivel mount kit or assembly 100 is comprised of a first insertable part 102, a second insertable part 104, and a securing part 106. The electronic device may be mounted to the second insertable part 104. The first insertable part 102 may then be secured to the tabletop, desktop, or other mounting structure using the securing part 106. The second insertable part 104 may thereafter be inserted into the first insertable part 102 to complete the mounting of the electronic device to the tabletop, desktop, or other mounting structure. The swivel mount kit or assembly 100 permits the electronic device to be mounted in either a "locking position" or a "swivel position", depending on the positioning of the second insertable part 104 while the second insertable part 104 is inserted into the first insertable part 102.

Alternatively, the electronic device may be secured to the first insertable part 102 using the screw holes 132 in the first plate part 120, and then the first insertable part 102 may be secured to the tabletop, desktop, or other mounting structure using the securing part 106. In such an arrangement, the electronic device is mounted to the tabletop, desktop, or other mounting structure without using the second insertable part 104.

INDUSTRIAL APPLICABILITY

To solve the aforementioned problems, the present embodiments provide a swivel mount kit or assembly for mounting an electronic device to a tabletop or other mounting structure with the swivel mount kit or assembly being set in either a "fixed position" or in a "swivel position".

It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described as being in particular combinations, each feature or element may be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that may be derived from the description contained herein by a person skilled in the art. No element, act, or instruction used in the description of the present application should be construed as critical or essential to the embodiments unless explicitly described as such. Also, as used herein, the article "a" is intended to include one or more items.

In addition, the above disclosed methods are not meant to limit the aspects of the embodiments, or to suggest that the aspects of the embodiments should be implemented following the aforementioned methods. The purpose of the aforementioned methods is to facilitate the understanding of one or more aspects of the embodiments and to provide the reader with one or many possible implementations of the processed discussed herein. It should be understood by one of ordinary skill in the art that the steps of the aforementioned methods may be performed in a different order and that some steps may be eliminated or substituted.

All United States patents and applications, foreign patents, and publications discussed above are hereby incorporated herein by reference in their entireties.

ALTERNATE EMBODIMENTS

Alternate embodiments may be devised without departing from the spirit or the scope of the embodiments.

What is claimed is:

1. A swivel mount kit, comprising:

(a) a first insertable part, comprising (1) a hollow, cylindrical body having an outer wall, at least part of the outer wall being threaded, (2) a first plate part attached to an end of the cylindrical body, and (3) a central opening that extends through the first plate part and through the cylindrical body to another end of the cylindrical body, (4) wherein (A) a lower surface of the first plate part faces the cylindrical body, and (B) an opposing upper surface of the first plate part faces away from the cylindrical body, and includes (i) a curved track formed at a predefined depth in the upper surface and having a predefined width, the curved track extending along a part of an imaginary circle that is concentric with the central opening and co-planar with the upper surface, and (ii) a locking region formed at the predefined depth in the upper surface at another location on the imaginary circle and having a particular shape and particular dimensions;

(b) a second insertable part, comprising (1) an elongated body configured for insertion into the central opening of the first insertable part, and (2) a second plate part attached to an end of the elongated body, wherein (A) an upper surface faces away from the elongated body, and (B) an opposing lower surface faces the elongated body, and includes (i) a protrusion extending away from the lower surface and having a particular shape and particular dimensions that correspond to the particular shape and particular dimensions of the locking region and that correspond to the pre-defined width of the curved track, the protrusion being disposed at a particular distance from a center of the elongated body that is a same distance as a radius of the imaginary circle, such that (I) upon the elongated body of the second insertable part being inserted into the central opening of the first insertable part and upon the protrusion being inserted into the locking region, the protrusion fits securely into the locking region and prevents the second insertable part from moving, and (II) upon the elongated body of the second insertable part being inserted into the central opening of the first insertable part and upon the protrusion being inserted into any location on the curved track, the protrusion is movable along the curved track, the second insertable part thereby being rotatable about a central axis of the central opening within a range of rotation limited by the movement of the protrusion; and (c) a securing part, including (1) a circular ring part that is threaded on its inside such that the ring part is rotatable along the threaded part of the outer wall of the cylindrical body of the first insertable part.

2. The swivel mount kit of claim 1, wherein (a) the first plate part is circular shaped, the imaginary circle being located at a circumference of the upper surface of the first plate part, (b) the curved track is disposed along a part of the circumference of the upper surface of the first plate part, and (c) the locking region is disposed at another location along the circumference of the upper surface of the first plate part.

3. The swivel mount kit of claim 2, wherein (a) the second plate part is circular shaped, and (b) the protrusion is disposed at a particular distance from a center of the elongated body that is a same distance as a radius of the first plate part.

4. The swivel mount kit of claim 1, wherein at least one of (a) the protrusion is one of a rectangular shaped block or pedestal, and the locking region is a rectangular shaped opening having a particular length and width that correspond to a particular length and width of the block or pedestal, or (b) the protrusion is a circular shaped pillar, and the locking region is a circular shaped opening having a particular radius that corresponds to a particular radius of the pillar.

5. The swivel mount kit of claim 1, further comprising (a) an alignment feature attached to the lower surface of the first plate part.

6. The swivel mount kit of claim 5, wherein (a) the cylindrical body of the first insertable part is configured to be inserted into an opening in a mounting structure, and (b) the alignment feature is configured to position the first insertable part while the cylindrical body is inserted in into the opening in the mounting structure.

7. The swivel mount kit of claim 6, wherein (a) the alignment feature is a circular element configured to be inserted into another opening in the mounting structure.

8. The swivel mount kit of claim 1, wherein the first plate part includes (a) a plurality of screw holes for securing the first plate part to a mounting structure.

9. The swivel mount kit of claim 1, wherein (a) the elongated body of the second insertable part is hollow.

10. The swivel mount kit of claim 9, wherein (a) a further central opening extends through the second plate part and the elongated body to another end of the elongated body, the further central opening being concentric with the central opening of the first insertable part upon the elongated body of the second insertable part being inserted into the central opening.

11. The swivel mount kit of claim 10, wherein the second plate part includes (a) a plurality of screw holes for securing the second plate part to an electronic device.

12. The swivel mount kit of claim 1, wherein the second insertable part includes (a) a pair of spring-like elements which extend from an outer wall of the elongated body at another end of the elongated body.

13. The swivel mount kit of claim 12, wherein (a) the central opening in the first insertable part forms a circular ring at the another end of the cylindrical body, and (b) upon the elongated body of the second insertable part being inserted into the central opening of the first insertable part, the pair of spring-like elements extend past the circular ring at the another end of the cylindrical body and extend outward to secure a top surface of the spring-like elements against the circular ring of the cylindrical body.

14. The swivel mount kit of claim 1, wherein (a) the cylindrical body of the first insertable part is configured to be inserted into an opening in a mounting structure, the opening extending from a first surface of the mounting structure to an opposing second surface of the mounting structure, and (b) the lower surface of the first plate part is configured to contact the first surface of the mounting structure upon the cylindrical body of the first insertable part being inserted into the opening in the mounting structure.

15. The swivel mount kit of claim 14, wherein (a) the securing part is configured to be turned about the threads of the cylindrical body until the securing part presses against the second, opposing surface of the mounting structure, thereby securing the first insertable part to the mounting structure.

16. A swivel mount kit for rotational mounting of an electronic device to a mounting structure, the swivel mount kit comprising:

(a) a first insertable part, comprising (1) a hollow, cylindrical body having an outer wall, at least part of the outer wall being threaded, the cylindrical body being configured to be inserted into an opening in the mounting structure, the opening extending from a first surface of the mounting structure to an opposing second surface of the mounting structure, (2) a first plate part attached to an end of the cylindrical body, and (3) a central opening that extends through the first plate part and through the cylindrical body to another end of the cylindrical body, (4) wherein (A) a lower surface of the first plate part faces the cylindrical body, the lower surface being configured to contact the first surface of the mounting structure upon the cylindrical body being inserted into the opening in the mounting structure, (B) an opposing upper surface of the first plate part faces away from the cylindrical body, and includes (i) a curved track formed at a predefined depth in the upper surface and having a predefined width, the curved track extending along a part of an imaginary circle that is concentric with the central opening and co-planar with the upper surface, and (ii) a locking region formed at the predefined depth in the upper surface at another location on the imaginary circle and having a particular shape and particular dimensions;

(b) an alignment feature attached to the lower surface of the first plate part and configured to position the first insertable part while the cylindrical body is inserted into the opening in the mounting structure, the alignment feature being a circular element configured to be inserted into another opening in the mounting structure; and (c) a securing part configured to secure the first insertable part to the mounting structure, and including (1) a circular ring part that is threaded on its inside such that the ring part is rotatable along the threaded part of the outer wall of the cylindrical body of the first insertable part, wherein (2) the securing part is configured to be turned about the threads of the cylindrical body until the securing part presses against the second, opposing surface of the mounting structure, thereby securing the first insertable part to the mounting structure.

17. The swivel mount kit of claim 16, further comprising (a) a second insertable part configured for mounting the electronic device, and comprising (1) an elongated body configured for insertion into the central opening of the first insertable part, and (2) a second plate part attached to an end of the elongated body, wherein (A) an upper surface faces away from the elongated body, and (B) an opposing lower surface faces the elongated body, and includes (i) a protrusion extending away from the lower surface and having a particular shape and particular dimensions that correspond to the particular shape and particular dimensions of the locking region and that correspond to the predefined width of the curved track, the protrusion being disposed at a same distance from a center of the elongated body as a radius of the imaginary circle upon which the curved track is disposed, such that (I) upon the elongated body of the second insertable part being inserted into the central opening of the first insertable part and upon the protrusion being inserted into the locking region, the protrusion fits securely into the locking region and prevents the second insertable part from moving, and (II) upon the elongated body of the second insertable part being inserted into the central opening of the first insertable part and upon the protrusion being inserted into any location on the curved track, the protrusion is movable along the curved track, the second insertable part thereby being rotatable about a central axis of the central opening within a range of rotation limited by the movement of the protrusion.

18. The swivel mount kit of claim 17, wherein (a) the first plate part is circular shaped, the imaginary circle being located at a circumference of the upper surface of the first plate part, (b) the curved track is disposed along a part of the circumference of the upper surface of the first plate part, (c) the locking region is disposed at another location along the circumference of the upper surface of the first plate part, (d) the second plate part is circular shaped, and (e) the protrusion is disposed at a particular distance from a center of the elongated body that is a same distance as a radius of the first plate part.

19. The swivel mount kit of claim 17, wherein at least one of (a) the protrusion is one of a rectangular shaped block or pedestal, and the locking region is a rectangular shaped opening having a particular length and width that correspond to a particular length and width of the block or pedestal, or (b) the protrusion is a circular shaped pillar, and the locking region is a circular shaped opening having a particular radius that corresponds to a particular radius of the pillar.

20. Swivel mount kit for rotational mounting of an electronic device to a mounting structure, the swivel mount kit comprising:

(a) a first insertable part, comprising (1) a hollow, cylindrical body having an outer wall, at least part of the outer wall being threaded, the cylindrical body being configured to be inserted into an opening in the mounting structure, the opening extending from a first surface of the mounting structure to an opposing second surface of the mounting structure, (2) a circular first plate part attached to an end of the cylindrical body, and (3) a central opening that extends through the first plate part and through the cylindrical body to another end of the cylindrical body, the central opening forming a circular ring at the another end of the cylindrical body, (4) wherein (A) a lower surface of the first plate part faces the cylindrical body, the lower surface being configured to contact the first surface of the mounting structure upon the cylindrical body being inserted into the opening in the mounting structure, (B) an opposing upper surface of the first plate part faces away from the cylindrical body, and includes (i) a curved track formed at a predefined depth in the upper surface and having a predefined width, the curved track extending along a part of a circumference of the upper surface of the first plate part, and (ii) a locking region formed at the predefined depth in the upper surface at another location on the circumference of the upper surface of the first plate part and having a particular shape and particular dimensions;

(b) an alignment feature attached to the lower surface of the first plate part and configured to position the first insertable part while the cylindrical body is inserted into the opening in the mounting structure, the alignment feature being a circular element configured to be inserted into another opening in the mounting structure;

(c) a securing part configured to secure the first insertable part to the mounting structure, and including (1) a circular ring part that is threaded on its inside such that the ring part is rotatable along the threaded part of the outer wall of the cylindrical body of the first insertable part, wherein (2) the securing part is configured to be turned about the threads of the cylindrical body until the securing part presses against the second, opposing surface of the mounting structure, thereby securing the first insertable part to the mounting structure;

(d) a second insertable part configured for mounting the electronic device, and comprising (1) an elongated body configured for insertion into the central opening of the first insertable part, including (A) a pair of spring-like elements which extend from an outer wall of the elongated body at an end of the elongated body, wherein (B) upon the elongated body of the second insertable part being inserted into the central opening of the first insertable part, the pair of spring-like elements extend past the circular ring at the end of the cylindrical body and extend outward to secure a top surface of the spring-like elements against the circular ring of the cylindrical body, and (2) a circular second plate part attached to another end of the elongated body, wherein (A) an upper surface faces away from the elongated body, and (B) an opposing lower surface faces the elongated body, and includes (i) a protrusion extending away from the lower surface and having a particular shape and particular dimensions that correspond to the particular shape and particular dimensions of the locking region and that correspond to the predefined width of the curved track, the protrusion being one of a rectangular shaped block or pedestal, and the locking region being a rectangular shaped opening having a particular length and width that correspond to a particular length and width of the block or pedestal, the protrusion being disposed at a particular distance from a center of the elongated body that is a same distance as a radius of the first plate part, such that (I) upon the elongated body of the second insertable part being inserted into the central opening of the first insertable part and upon the protrusion being inserted into the locking region, the protrusion fits securely into the locking region and prevents the second insertable part from moving, and (II) upon the elongated body of the second insertable part being inserted into the central opening of the first insertable part and upon the protrusion being inserted into any location on the curved track, the protrusion is movable along the curved track, the second insertable part thereby being rotatable about a central axis of the central opening within a range of rotation limited by the movement of the protrusion.

\* \* \* \* \*